United States Patent
Akiyama et al.

(10) Patent No.: US 8,901,838 B2
(45) Date of Patent: *Dec. 2, 2014

(54) SEMICONDUCTOR DEVICE, LED DRIVING CIRCUIT, AND APPARATUS FOR DISPLAYING AN IMAGE

(75) Inventors: Noboru Akiyama, Hitachinaka (JP); Takayuki Hashimoto, Tokai (JP); Takashi Hirao, Hitachinaka (JP); Nobuyoshi Matsuura, Takasaki (JP); Hideo Ishii, Takasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 158 days.

This patent is subject to a terminal disclaimer.

(21) Appl. No.: 13/560,613

(22) Filed: Jul. 27, 2012

(65) Prior Publication Data

US 2012/0287097 A1 Nov. 15, 2012

Related U.S. Application Data

(63) Continuation of application No. 12/779,343, filed on May 13, 2010, now Pat. No. 8,258,711.

(30) Foreign Application Priority Data

May 15, 2009 (JP) .................................. 2009-118252

(51) Int. Cl.
*H05B 37/02* (2006.01)
*H01L 29/78* (2006.01)
(Continued)

(52) U.S. Cl.
CPC ........ *H01L 29/7813* (2013.01); *H01L 29/7811* (2013.01); *G09G 2320/064* (2013.01);
(Continued)

(58) Field of Classification Search
USPC ............ 315/291, 307, 224, DIG. 4, 194, 297, 315/204, 209 R, 308, 185 R, 185 S, 3, 12; 257/E25.028, 43, E29.296, E29.068; 438/104, 158, 151
See application file for complete search history.

(56) References Cited

U.S. PATENT DOCUMENTS 6,621,235 B2 * 9/2003 Chang ........................... 315/216
7,122,971 B2 * 10/2006 Yeh et al. .................. 315/185 R
(Continued)

FOREIGN PATENT DOCUMENTS

JP 2005537669 12/2005
JP 2006500780 1/2006
(Continued)

OTHER PUBLICATIONS

Japanese Office Action mailed on Feb. 26, 2013 in corresponding Japanese Patent Application No. 2009-118252 with English language translation.

(Continued)

*Primary Examiner* — Thienvu Tran
*Assistant Examiner* — Christopher Lo
(74) *Attorney, Agent, or Firm* — Brundidge & Stanger, P.C.

(57) ABSTRACT

The semiconductor device is included in the LED driving circuit (current regulator) of driving the LED array (with series-connected number m×parallel-connected number n), and is formed of a plurality (n pieces) of LED driving devices of controlling a current (constant-current driving) flowing in each string. A vertical semiconductor device, for example, a vertical MOSFET is used as the LED driving device. Both of a main device functioning as a constant-current driving device and a subsidiary device functioning as a circuit-breaking switch during dimming are formed inside a chip of the device, which are formed of the vertical semiconductor devices. In a first surface of the device, each source region of the main device and the subsidiary device is formed so as to be insulated from each other through an isolation region.

15 Claims, 15 Drawing Sheets

(51) Int. Cl.
*H05B 33/08* (2006.01)
*G09G 3/34* (2006.01)
*H01L 29/06* (2006.01)
*H01L 29/417* (2006.01)

(52) U.S. Cl.
CPC .......... *H01L 29/0619* (2013.01); *H05B 33/089* (2013.01); *H05B 33/0827* (2013.01); *H05B 33/0818* (2013.01); *H01L 29/41766* (2013.01); *G09G 3/342* (2013.01); *H01L 29/0615* (2013.01); *Y02B 20/347* (2013.01); *H01L 29/7803* (2013.01)
USPC .......... 315/216; 315/194; 315/291; 315/297; 315/312; 315/315

(56) References Cited

U.S. PATENT DOCUMENTS

| | | |
|---|---|---|
| 2006/0163652 A1 | 7/2006 | Lowis |
| 2006/0256050 A1* | 11/2006 | Ikeda .............................. 345/82 |
| 2009/0096739 A1 | 4/2009 | Lan et al. |
| 2010/0177127 A1 | 7/2010 | Akiyama et al. |

FOREIGN PATENT DOCUMENTS

| | | |
|---|---|---|
| JP | 2006202855 | 8/2006 |
| JP | 2006319057 | 11/2006 |
| JP | 2007-129862 | 5/2007 |
| WO | 2004021744 | 3/2004 |
| WO | 2004030106 | 4/2004 |

OTHER PUBLICATIONS

LM3432/LM3432B "6-Channel Current Regulator for LED Backlight Application" published by National Semiconductor Corporation on May 22, 2008.

U.S. Appl. No. 12/683,697, filed Jan. 7, 2010.

* cited by examiner

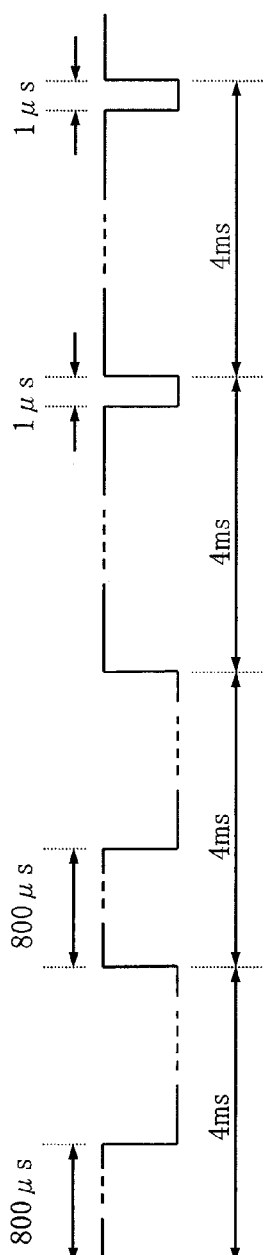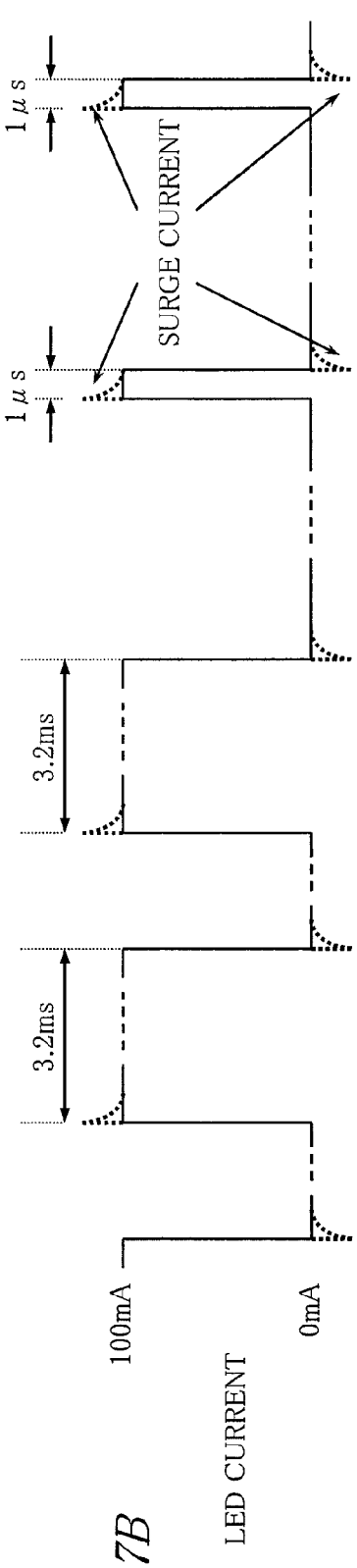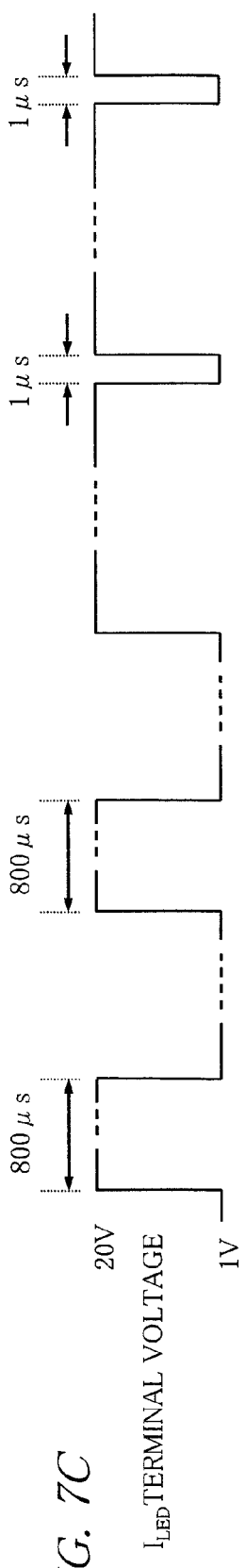

SEMICONDUCTOR DEVICE, LED DRIVING CIRCUIT, AND APPARATUS FOR DISPLAYING AN IMAGE

CROSS-REFERENCE TO RELATED APPLICATION

The present application is a continuation application of U.S. application Ser. No. 12/779,343, filed May 13, 2010 and claims priority from Japanese Patent Application No. 2009-118252 filed on May 15, 2009, the contents of which are hereby incorporated by reference into this application.

TECHNICAL FIELD OF THE INVENTION

The present invention relates to an LED (light emitting diode) driving technology, and more particularly, the present invention relates to a technology effectively applied to a semiconductor device (LED driving device) of driving an LED array, an LED driving circuit using the semiconductor device, and an apparatus for displaying images having the LED array and the LED driving circuit.

BACKGROUND OF THE INVENTION

For a backlight of a liquid crystal panel used for a mobile phone or others, a white light-emitting LED is used. In order to obtain an evenly-uniformed light emission luminance, it is required to drive the LED under a constant current condition so that a predetermined constant current is flown in the LED.

As a technique relating to this, a specification of U.S. Pat. No. 6,621,235 (Patent Document 1) discloses a technique of uniformly emitting an LED array in which LED devices are connected in multi series and multi parallel. Also, Japanese Patent Application Laid-Open Publication No. 2007-129862 (Patent Document 2) and LM3432 datasheet "LM3432/LM3432B 6-Channel Current Regulator for LED Backlight Application" published by National Semiconductor Corporation on May 22, 2008 (Non-Patent Document 1) disclose a technique of controlling a voltage applied to an LED array in accordance with variation in a forward voltage VF of the LED so that a voltage applied to a constant-current driving device is not unnecessarily increased, and a technique of suppressing "generation of a power control signal with a fault voltage level" and "abnormal operation of an LED short detecting circuit" due to increase of an LED terminal voltage in digitally dimming an LED array.

SUMMARY OF THE INVENTION

When an LED (LED array) is used for a backlight of a large-scaled liquid crystal panel used for a television, a display, and others, it is required that a current (LED current) flowing in the LED array is increased larger than the conventional one. In other words, with the large-scaling, it is required to largely increase the LED current and provide a packaging configuration of an LED driving circuit of handling the increased current.

However, in the technique disclosed in Patent Document 1, a plurality of constant-current driving devices (transistors or MOSFETs (Metal Oxide Semiconductor Field Effect Transistor)) are integrated (made to be an IC) on single chip. Therefore, when the LED current is increased, there are problems such as increase of a chip area and large increase in temperature by power consumption.

As one means (configuration example) for avoiding the problems, it is considered to drive a current for one column (one string) of the LED array by a plurality (for example, two) of constant-current driving devices (LED driving devices) which are connected in parallel. However, this case has a problem that, the number of required driving devices is increased, and as a result, the number of used IC chips (circuit scales) is increased.

Also, in the techniques disclosed in Patent Document 2 and Non-Patent Document 1, when the number of driving devices (corresponding to a parallel-connected number (n) of strings in the LED array) is decreased by increasing a series-connected number (m) (number of LEDs configuring one string) in the LED array of handling the largely-increased LED current, high breakdown voltage is required to an IC chip (constant-current controlling circuit) for controlling the constant-current driving, and therefore, there is a problem that, fabrication process for the IC is complicated, and as a result, fabrication cost is increased.

A preferred main aim of the present invention is, according to the above-described LED driving technique, to provide a technique capable of suppressing or reducing a footprint (scale) of entire LED driving circuits (devices) and fabrication cost for an IC chip and others with satisfying a condition capable of driving the LED under a constant current condition even when a large current is flown in an LED array.

The above and other preferred aims and novel characteristics of the present invention will be apparent from the description of the present specification and the accompanying drawings.

The typical ones of the inventions disclosed in the present application will be briefly described as follows. A typical embodiment of the present invention provides a technique for a semiconductor device (LED driving device) of driving an LED, an LED driving circuit using the semiconductor device, an apparatus for displaying images having the LED driving circuit, and others, and has a configuration described below.

The semiconductor device according to the present embodiment is an individual one of a plurality of semiconductor devices (LED driving devices) included in an LED driving circuit of driving an LED array with "series-connected number m×parallel-connected number n", that is an LED array in which n pieces of LED strings each having m pieces of LEDs connected in series are connected in parallel. And, the semiconductor device is connected with each string in series for controlling (driving under a constant current condition) a current (large current) flowing in the corresponding string. The semiconductor device (LED driving device) has plural (n) pieces so as to correspond to the parallel-connected number "n" of the LEDs. For the semiconductor device, a vertical semiconductor device carrying a current in a vertical direction such as a vertical MOSFET or a vertical bipolar transistor is used.

In a chip of the semiconductor device, both of a main device (first vertical semiconductor device) functioning as a constant-current driving device and a subsidiary device (second vertical semiconductor device) functioning as a circuit-breaking switch during dimming are formed by the vertical semiconductor device. And, the main device and the subsidiary device share a drain region (or collector region) with each other. The main device has a first source region (or first emitter region) and a first gate electrode (or first base electrode), and the subsidiary device has a second source region (or second emitter region) and a second gate electrode (or second base electrode). The first source region (or first emitter region) and the second source region (or second emitter region) are formed in a first surface of the semiconductor device by doping a first impurity, and are electrically insulated from each other through an isolation region formed in the first surface by doping a second impurity having an opposite polarity to the first impurity.

Also, in the present embodiment, more particularly, the plurality (n pieces) of the LED driving devices (semiconductor devices) and a controlling circuit of controlling the LED driving devices under a constant current condition are formed in one package.

By the configuration, the number of the LED driving devices in the LED driving circuit can be suppressed or reduced, and an IC chip with a low breakdown voltage can be used for the constant-current driving control, so that the footprint or others can be suppressed or reduced.

The effects obtained by typical aspects of the present invention disclosed in the present application will be briefly described as follows. According to the typical embodiment of the present invention, the footprint (scale) of the entire LED driving circuit (device) and fabrication cost for the IC chip or others can be suppressed or reduced with satisfying the condition of achieving to drive the LED under a constant current condition even when a large current is flown in the LED array.

BRIEF DESCRIPTIONS OF THE DRAWINGS

FIG. 7A is a diagram illustrating a voltage-waveform example (of a dimming signal, an LED current, and an ILED terminal voltage, respectively) in digital dimming according to the first embodiment;

FIG. 7B is a diagram illustrating a voltage-waveform example (of a dimming signal, an LED current, and an ILED terminal voltage, respectively) in digital dimming according to the first embodiment;

FIG. 7C is a diagram illustrating a voltage-waveform example (of a dimming signal, an LED current, and an ILED terminal voltage, respectively) in digital dimming according to the first embodiment;

Figure 14:
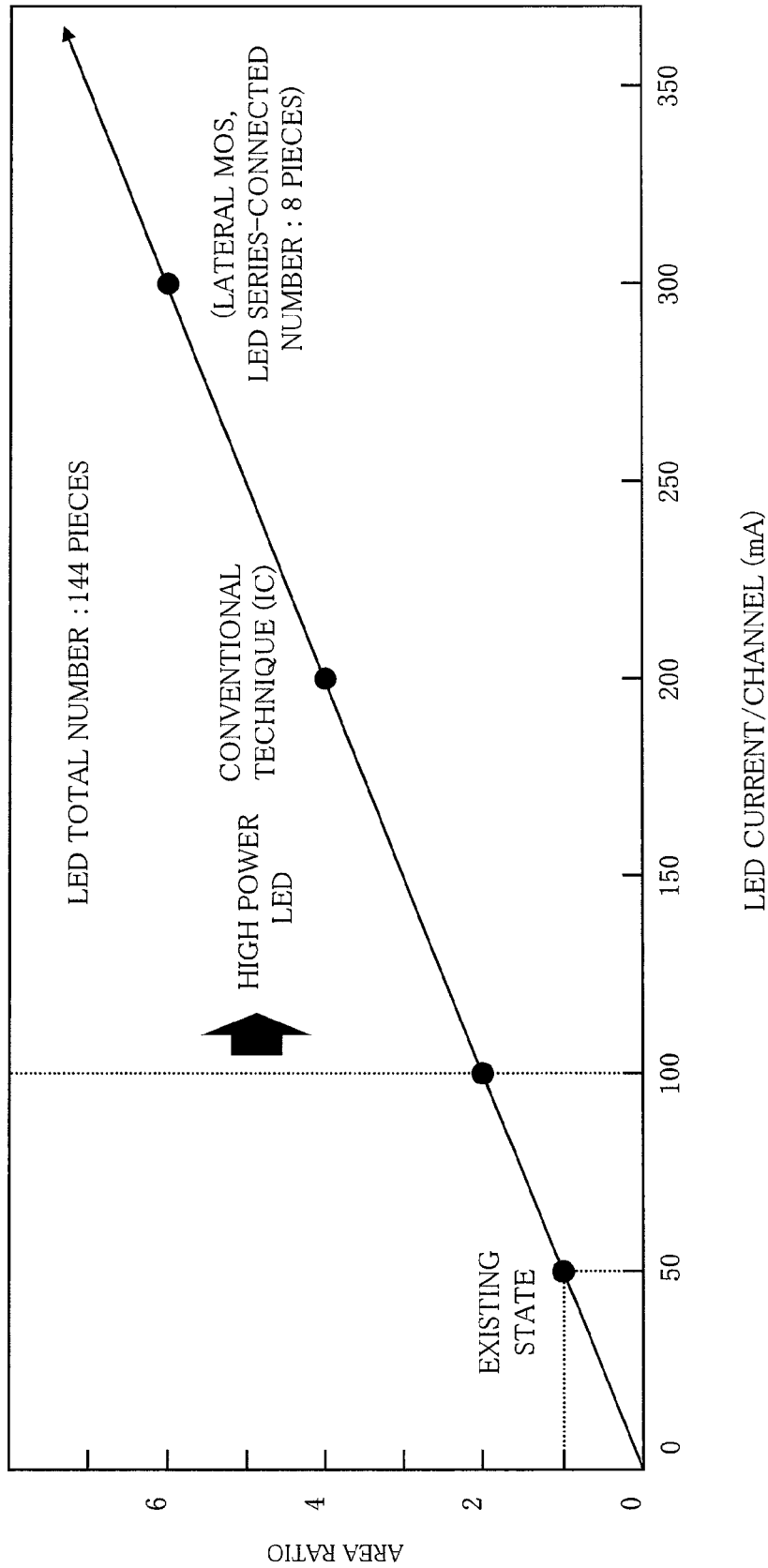
Figure 15:
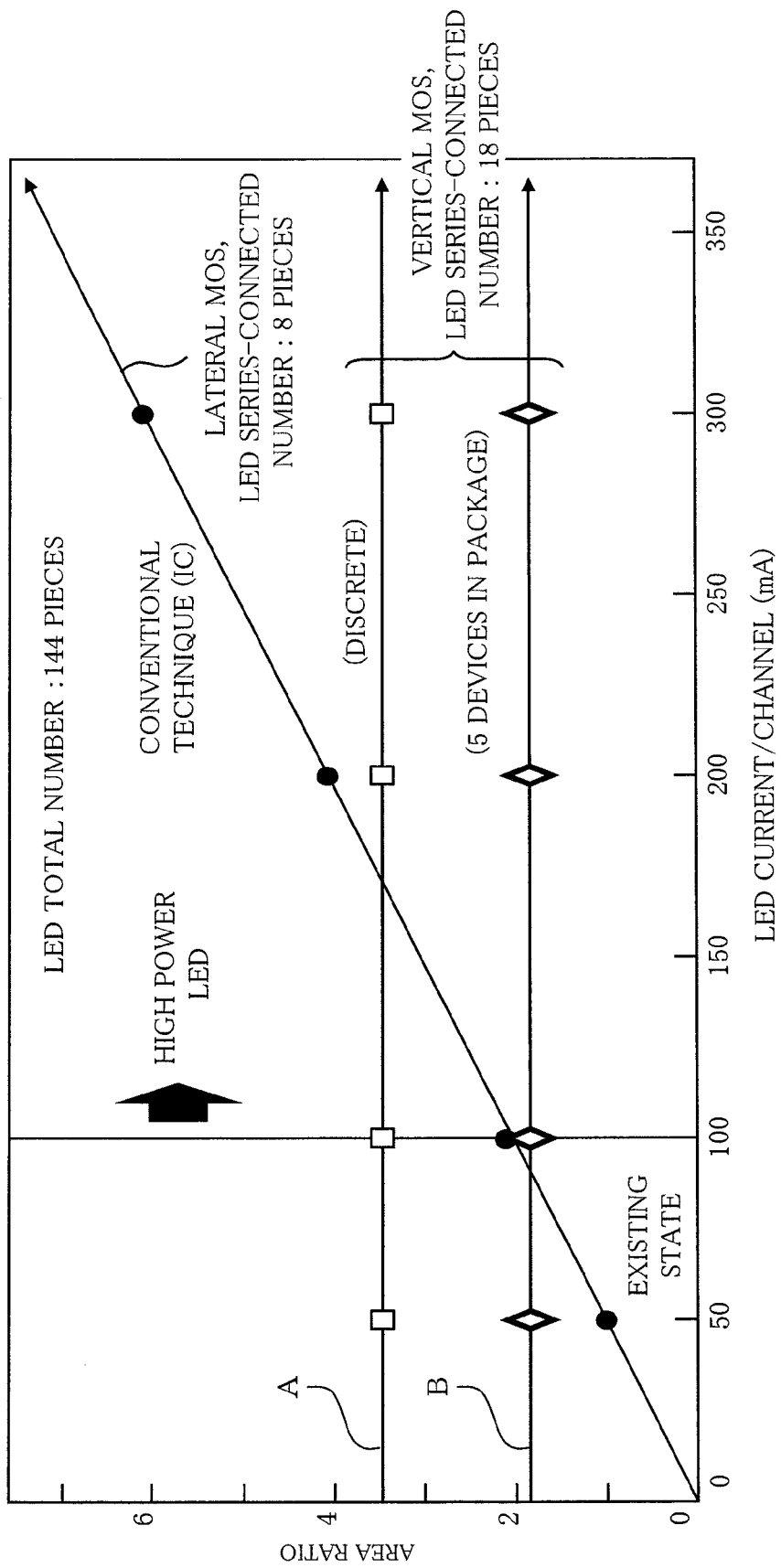

FIG. 14 is a graph illustrating a relation between an LED current per channel and a footprint of a current regulator in a conventional-technique example; and FIG. 15 is a graph illustrating a relation between the LED current per one channel and the footprint of the current regulator in the LED driving circuit in each of the first and second embodiments and the conventional-technique example to be compared with these embodiments.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

<Features>

Figure 1:
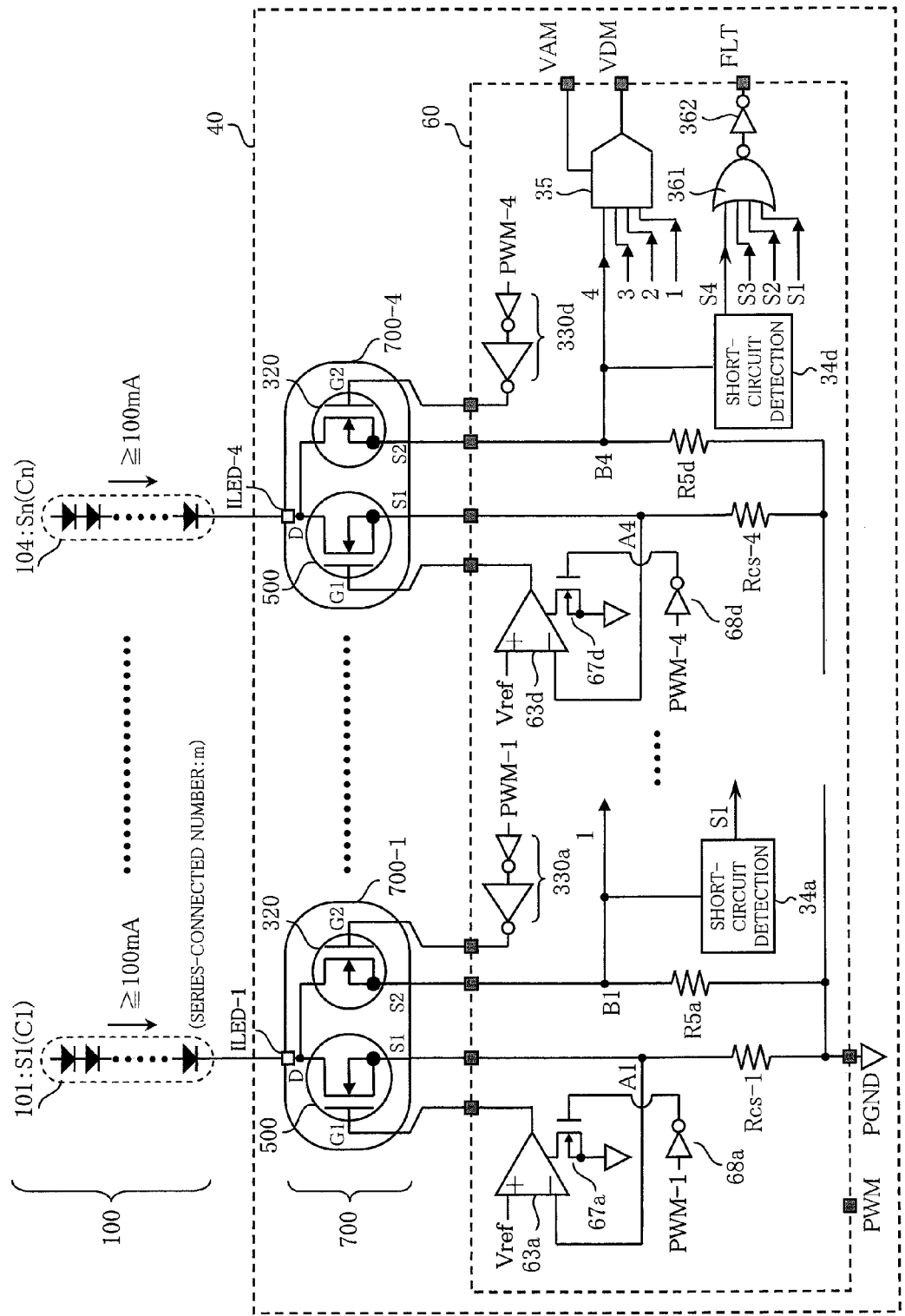
FIG. 1 is a diagram illustrating a configuration example of functional blocks of LED driving devices, a constant-current controlling circuit (IC) of controlling the LED driving devices, an LED array, and others, according to a first embodiment of the present invention.

Outlines and features of the present embodiment are described as follows (the following symbols are corresponded to those in later descriptions). In FIG. 1 and others, an apparatus for displaying images (liquid crystal display) according to the present embodiment has an LED driving circuit 1 for an LED array 100 used for a backlight of a large-scaled liquid crystal panel 200. The LED driving circuit 1 has: a plurality (n pieces) of semiconductor devices 700 each to be an LED driving device (constant-current driving device of driving and controlling to carry a uniformed constant current to each LED) connected in series with an LED string (S) in the LED array 100 (series-connected number m×parallel-connected number n); and a constant-current controlling circuit 60 connected with the semiconductor devices. For each semiconductor device 700, a vertical semiconductor device (for example, vertical MOSFET or others) is used, the vertical semiconductor device having a lower ON resistance than that of a lateral device and being effective for largely increasing an LED current. And, an inside of the semiconductor device 700 has a configuration in which a main device 500 functioning as the constant-current driving device and a minute-sized subsidiary device 320 functioning as a circuit-breaking switch during dimming are integrated with using vertical semiconductor devices.

In this manner, the series-connected number m in the LED array 100 is increased and the parallel-connected number n therein is decreased compared with a conventional configuration, so that the number and scale of devices and a circuit (the plurality of LED driving devices 700 and the constant-current controlling circuit 60 of controlling to drive the LED driving devices under a constant current condition) for controlling to drive the LED array 100 with the constant current can be reduced. That is, the footprint of the LED driving circuit 1 and its fabrication cost can be reduced.

Figure 6:
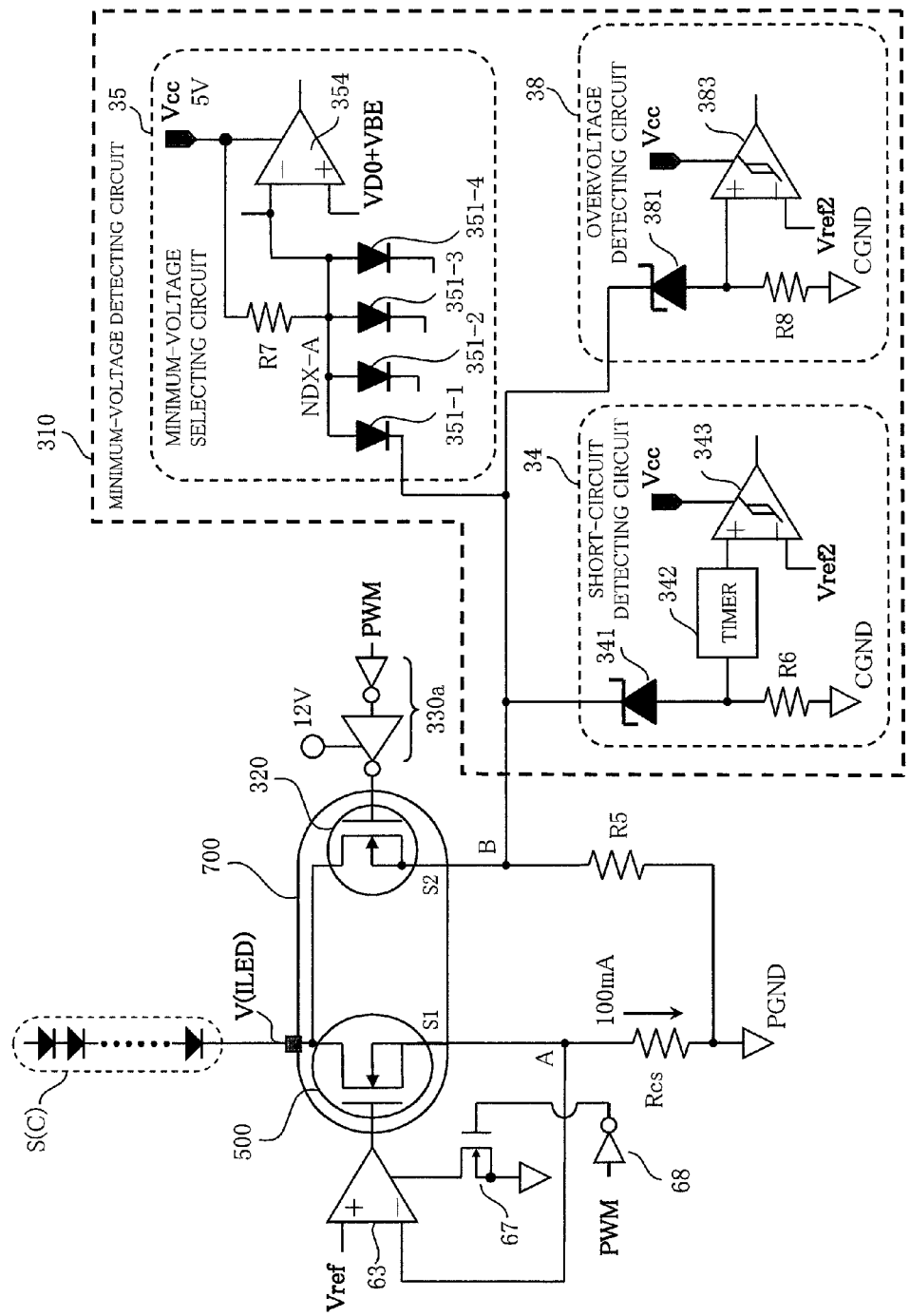
FIG. 6 is a diagram illustrating a configuration example of a functional block of a minimum-voltage detecting circuit in a constant-current controlling circuit according to the first embodiment.

Also, the constant-current controlling circuit (IC) 60 has a minimum-voltage detecting circuit 310 (see FIG. 6 and others). The minimum-voltage detecting circuit 310 selects a minimum voltage from a voltage of each terminal (input terminal of the LED current) on the LED string (S) side in the plurality (n pieces) of semiconductor devices 700 corresponding to the parallel-connected number n of the LED strings (S). And, the minimum-voltage detecting circuit 310 compares the minimum voltage with a predetermined voltage, and, based on their difference, outputs a command signal "VDM" for controlling an LED driver 10 (power-supply control IC 20) used for an LED power driving.

Further, in the LED driving circuit 1, the LED driver 10 has the power-supply control IC 20 connected with the constant-current controlling circuit 60 (minimum-voltage detecting circuit 310). Based on the command signal from the minimum-voltage detecting circuit 310, the power-supply control IC 20 controls an applied voltage (Vout) to the LED array 100 so as to be an appropriate voltage smaller than an initial set voltage.

Still further, in the digital dimming, based on a digital dimming signal, the minimum-voltage detecting circuit 310 outputs the command signal "VDM" when the constant-current driving device (main device 500) is driven under a constant current condition (the digital dimming signal is at a low level). When the constant-current driving device is turned off or almost off (the digital dimming signal is at a high level), the minimum-voltage detecting circuit 310 is electrically broken from the LED array 100 by the circuit-breaking switch during dimming (subsidiary device 320).

First Embodiment

With reference to FIGS. 1 to 9, a semiconductor device, an LED driving circuit, and others according to a first embodiment of the present invention are described.

<Vertical Semiconductor Device and Constant-Current Controlling Circuit>

FIG. 1 illustrates a configuration having: LED array 100; a plurality of vertical semiconductor devices 700 (n-channel vertical power MOSFET) each being a semiconductor device (LED driving device or constant-current driving device) according the present embodiment; a constant-current controlling circuit (constant-current control ICs) 60 of controlling the LED array and the vertical semiconductor devices; and others. Note that, in FIG. 1, a package of the vertical semiconductor devices 700 and the constant-current controlling circuit 60 is omitted for easy to see (a configuration example of the package will be described later in FIG. 5 and others).

The LED array 100 is an array with "series-connected number m×parallel-connected number n", that is a configuration in which LED strings (S) each having a plurality (m pieces) of LEDs connected in series are connected by the parallel-connected number n. For example, in "n=4", there are provided LED strings 101 "S1" to 104 "S4". Also, the LED array 100 (S1 to S4) is formed of power LEDs in which a current of at least 100 mA or larger can be flown. Note that the string (channel) is denoted by "S" (C). The current (LED current) flowing in the LED string (S) and a terminal of the vertical semiconductor device 700 for the current are denoted by "ILED".

For the vertical semiconductor device 700 (its discrete chip), a vertical power MOS (MOSFET is properly abbreviated as MOS) having a lower ON resistance than that of a lateral semiconductor device is used. Inside the chip (700), there are formed: a main device (main MOS, first vertical semiconductor device) 500 functioning as the constant-current driving device; and a minute-sized subsidiary device (subsidiary MOS, second vertical semiconductor device) 320 functioning as the circuit-breaking switch during dimming.

The constant-current controlling circuit 60 is an integrated circuit (IC) having: operational amplifiers 63a to 63d; PWM (pulse width modulation) dimming controlling devices 67a to 67d; PWM dimming controlling circuits 68a to 68d (main-device side) and 330a to 330d (subsidiary-device side); current sensing resistors Rcs-1 to Rcs-4; short-circuit detecting circuits 34a to 34d; a minimum-voltage selecting circuit 35; a NOR (negative OR) circuit 361; an inverter circuit 362; and others.

An LED current (ILED-1) flowing in the LED string (for example, S1) is inputted to a drain (D) of the constant-current driving device (main device 500), is outputted from a source (S) of the same, is flown in the current sensing resistor Rcs-1 of the constant-current controlling circuit 60, and is reached to ground (PGND). A voltage at a node A1 generated by the LED current flowing in the current sensing resistor Rcs-1 is inputted to an inverting input terminal (−: negative side) of the operational amplifier 63a. An output (connected with a gate (G1) of the main device 500) of the operational amplifier 63a is fed back so that the voltage is matched with a set voltage Vref, and the ON resistance of the constant-current driving device (main device 500) is adjusted. Therefore, in the LED string (S1), a predetermined constant current (≥100 mA) is flown. This sequential operation is the same as those in other LED strings (S2 to S4).

The minimum-voltage selecting circuit 35 selects a minimum voltage among voltages of a plurality of nodes B1 to B4 (each connected with a source (S2) of the subsidiary device 320), and outputs a command signal from a VDM terminal to a power-supply control IC 20 described later.

Each short-circuit detecting circuit 34 (34a to 34d) starts a timer when each voltage of the corresponding nodes B1 to B4 is over a predetermined voltage. If the voltage is still over the predetermined voltage after predetermined time, the short-circuit detecting circuit 34 outputs an abnormal detection signal indicating abnormal detection from a FLT terminal to a microcomputer (not illustrated).

<Vertical MOSFET>

Figure 2:
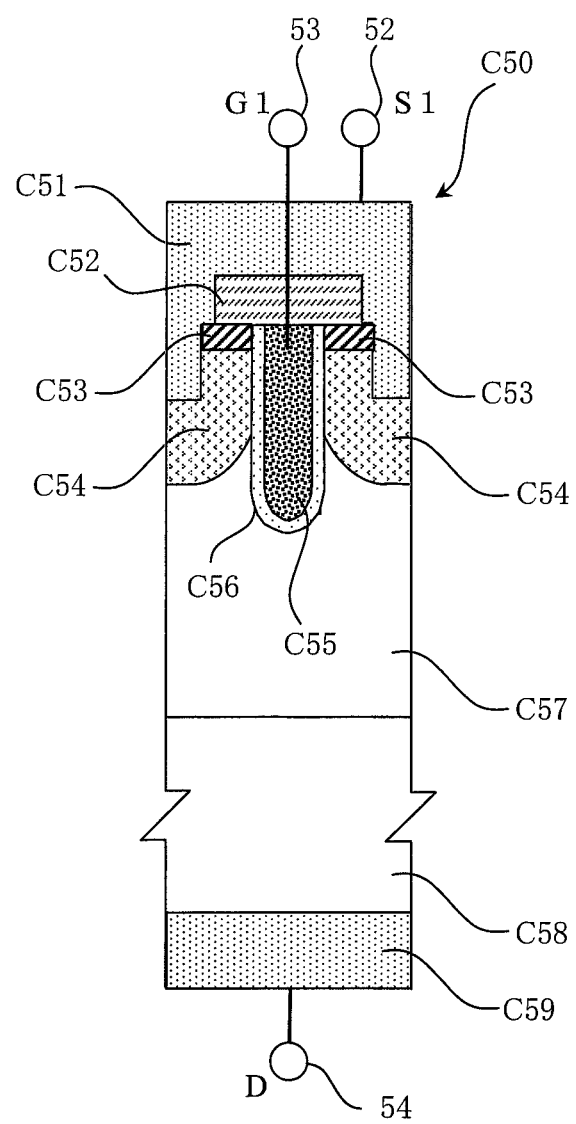
FIG. 2 is a view illustrating a cross-sectional structure example of a vertical semiconductor device (n-channel vertical MOSFET) according to the first embodiment, which illustrates a structure example of a unit cell configuring the vertical semiconductor device.
Figure 3:
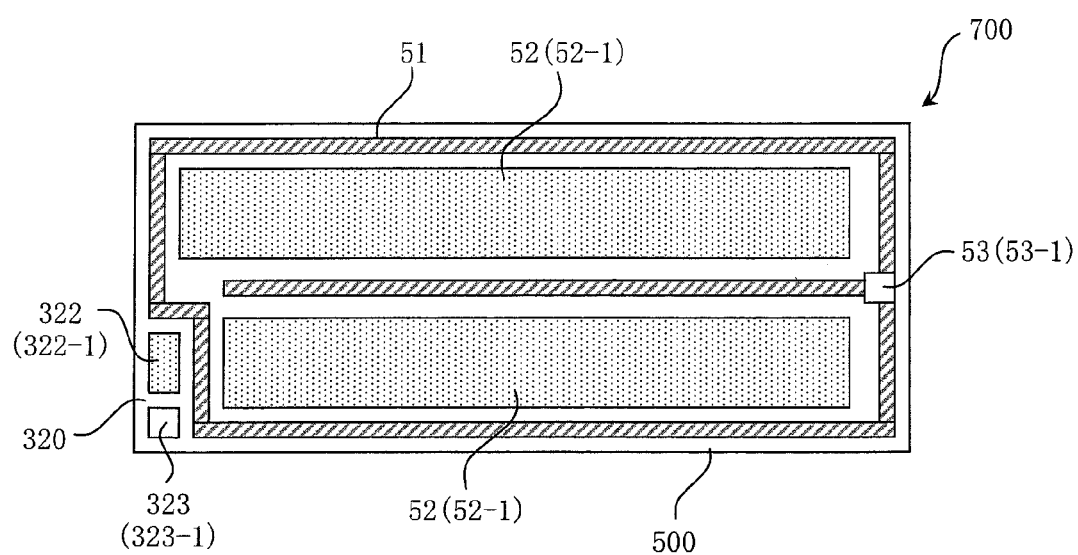
FIG. 3 is a view illustrating a planar structure example of the vertical semiconductor device (n-channel vertical MOSFET) (700) according to the first embodiment.
Figure 4:
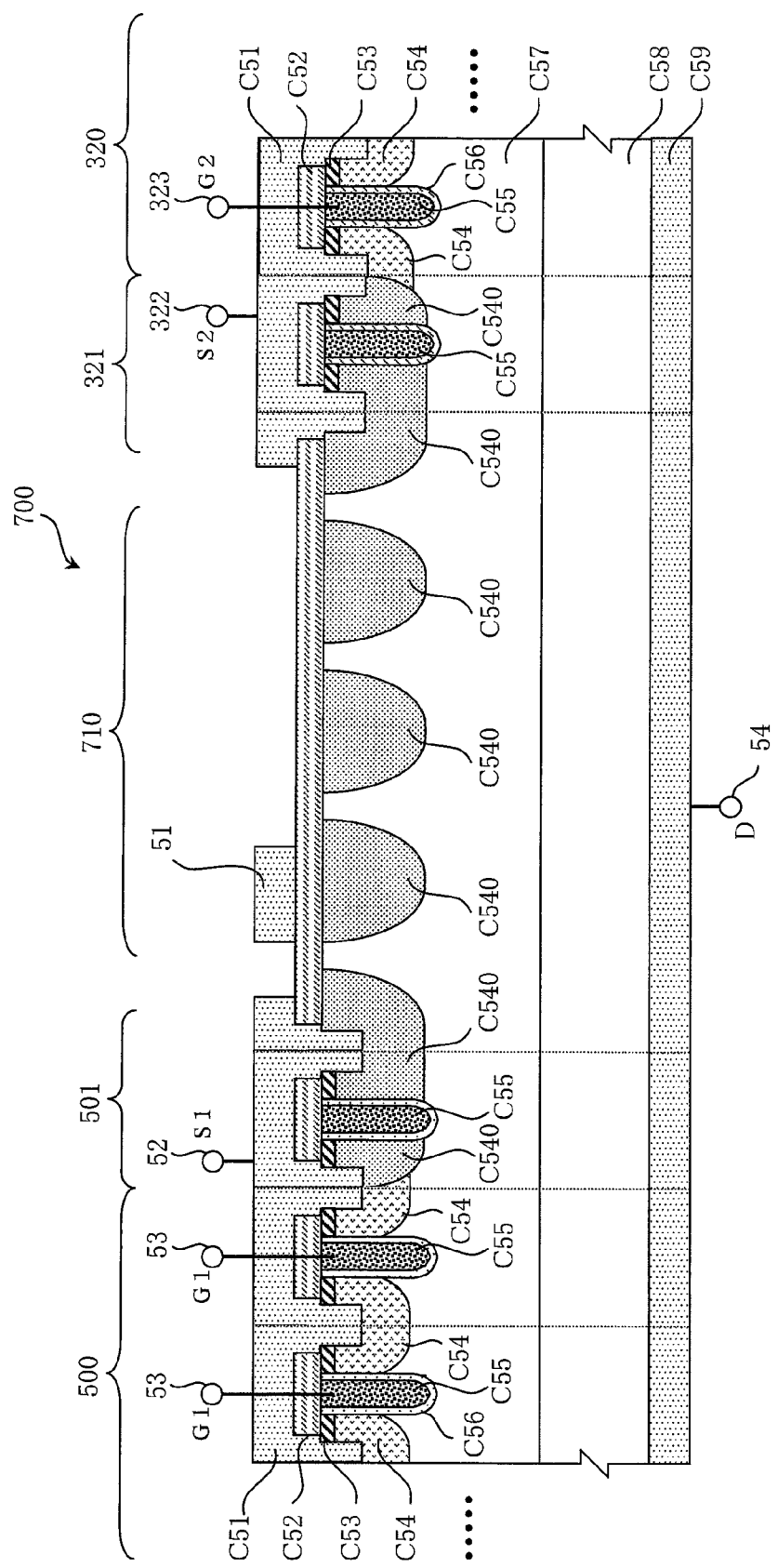
FIG. 4 is a view illustrating a cross-sectional structure example of the vertical semiconductor device (n-channel vertical MOSFET) according to the first embodiment, which illustrates a structure example in a vicinity of an isolation region electrically insulating between the main MOSFET and the subsidiary MOSFET.

FIGS. 2 to 4 illustrate a structure example of an n-channel vertical MOSFET which is one example of the vertical semiconductor device 700. FIG. 2 illustrates a cross-sectional structure example (vertical cross section) of a unit cell configuring the device 700, FIG. 3 illustrates a planar structure example of a plane (first surface on which the main device 500 and the subsidiary device 320 are formed) of the device 700, and FIG. 4 illustrates a cross-sectional structure example in a vicinity of an isolation region 710 electrically insulating between the main MOS 500 and the subsidiary MOS 320 on the plane (first surface) of the device 700.

In FIG. 2, a unit cell C50 of the vertical semiconductor device 700 (n-channel vertical MOSFET) has: a metal thin film (for example, aluminum film) C51 to be a source electrode 52; an insulating film C52; an n$^+$-type semiconductor region C53; a p-type semiconductor region C54; an n$^+$-type polycrystalline semiconductor region C55 to be a gate electrode 53; a gate oxide film C56; an n$^-$-type semiconductor region C57; an n$^+$-type semiconductor region C58; a metal thin film C59 to be a drain electrode 54; and others. A width of the unit cell C50 is about 1 to 2 μm, and several thousands of the unit cells C50 are arranged to form a transistor unit of the vertical semiconductor device 700 (n-channel vertical MOSFET chip). For example, a group of the metal thin films C51 becomes source-electrode pads 52-1 (main side) and 322-1 (subsidiary side) in FIG. 3.

In FIG. 3, the vertical semiconductor device 700 (n-channel vertical MOSFET) further has: gate-electrode pads 53-1 (main side) and 323-1 (subsidiary side); a gate-finger wiring 51 formed of a metal thin film (for example, aluminum film); and others. The gate-finger wiring 51 is provided for decreasing a resistance of a wiring connection between the $n^+$-type polycrystalline semiconductor region C55 forming the gate region and the gate electrode pad 53-1.

Note that, in FIGS. 2 and 4, for easily understanding an electrode structure of the unit cell C50, a terminal line is pulled out from the region to be respective electrode, and is schematically denoted as S1 and S2 (S: source), G1 and G2 (G: gate), and D: drain, respectively. In the unit cell C50, the current is flown from the drain electrode 54 side (metal thin film C59 side) to the source electrode 52 side (metal thin film C51 side) in a vertical direction. The vertical MOSFET is an device that a channel is formed in a vertical direction (thickness direction) of a semiconductor chip, and therefore, a channel width per unit area can be increased larger than that of a lateral MOSFET, so that the vertical MOSFET has a feature of a lower ON resistance than that of the lateral device (lateral MOSFET).

In FIG. 4, in the isolation region 710 in the surface (first surface) of the vertical semiconductor device 700, floating p-type semiconductor regions C540 are provided between the main MOS 500 and the subsidiary MOS 320, so that it is suppressed to extend a depletion layer formed when a voltage difference is caused between the source S1 on the main MOS 500 side and the source S2 on the subsidiary MOS 320 side, and therefore, a breakdown voltage between the main MOS 500 and the subsidiary MOS 320 is secured.

Note that "501" and "321" are end cells of the main MOS 500 and the subsidiary MOS 320, respectively, which are dummy cells for preventing deterioration of process accuracy of the trench gate C55 at an end portion of the MOSFET.

The source region (C53 on the main-device side) of the main device 500 and the source region (C53 on the subsidiary-device side) of the subsidiary device 320 are formed in the first surface of the vertical semiconductor device 700 by doping a first impurity. And, the isolation region 710 electrically insulating between the source regions of both devices is formed in the first surface by doping a second impurity having an opposite polarity to the first impurity. Also, an entire area of the source region of the subsidiary device 320 in the first surface is smaller than that of the main device 500.

Further, as illustrated in FIG. 3, the gate-electrode pad 53-1 on the main device 500 side and the gate-electrode pad 323-1 on the subsidiary device 320 side are formed on the plane of the vertical semiconductor device 700 at a position away from each other (in this example, an opposite side-end portion to each other).

<Apparatus for Displaying Images, LED Array, and LED Driving Circuit>

Figure 5:
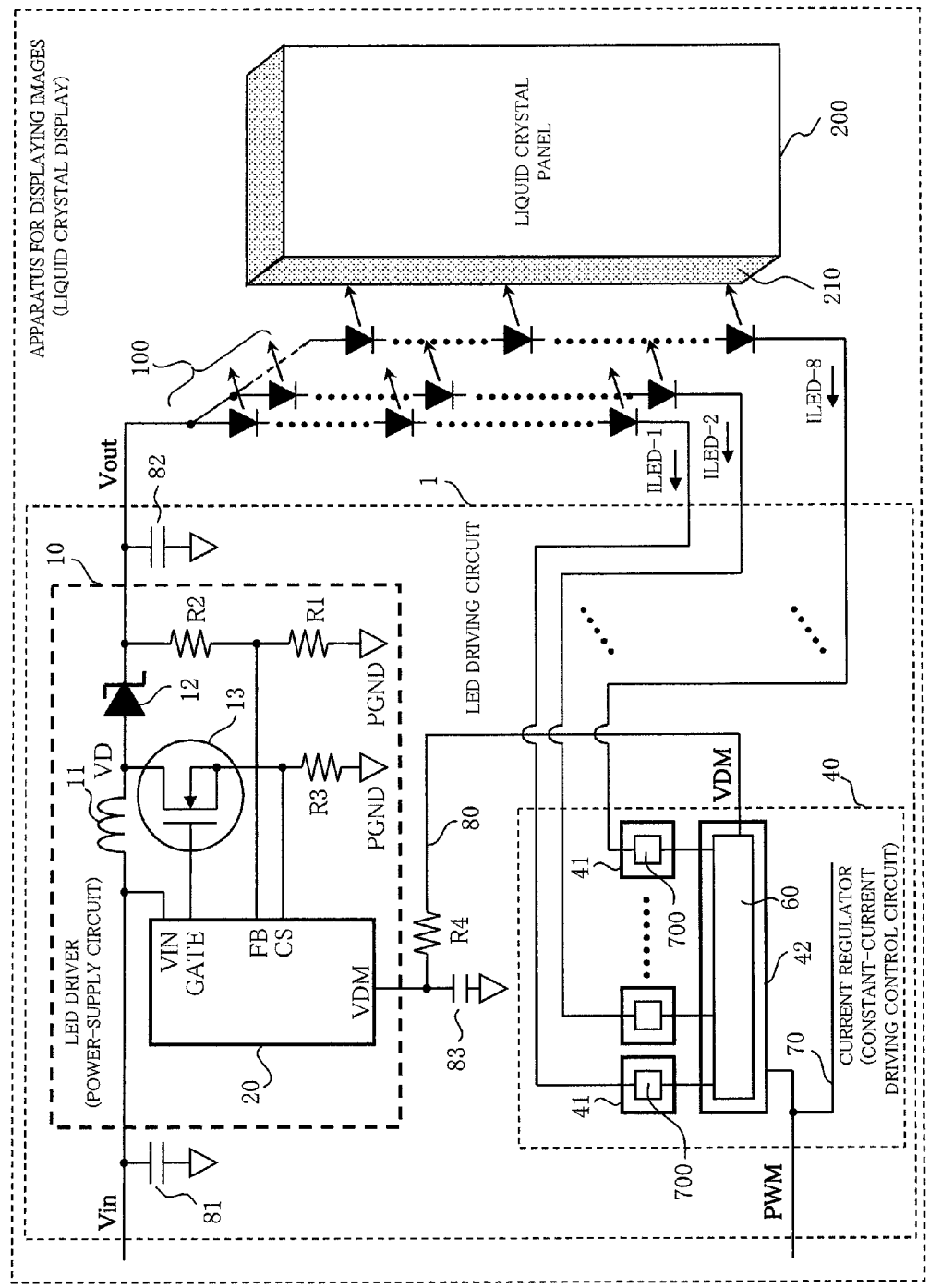
FIG. 5 is a diagram illustrating a configuration example of functional blocks of an LED driving circuit using the vertical semiconductor device and an apparatus for displaying images including the LED driving circuit according to the first embodiment.

FIG. 5 illustrates a configuration of a functional block of an apparatus for displaying images (liquid crystal display) having: the LED driving circuit 1 using the vertical semiconductor device 700; the LED array 100; and a liquid crystal panel (display panel) 200.

The LED array 100 is arranged so as to be lined on a bottom surface 210 side of the liquid crystal panel 200 as an LED backlight for the liquid crystal panel 200 in an edge lighting method. An incident light from the bottom surface 210 proceeds through a light guide panel (not illustrated) inside the liquid crystal panel 200, and is diffused by an optical diffusion film (not illustrated), so that a rear plate of the liquid crystal panel 200 is lighted by white light. The white light is polarized by liquid crystal devices (not illustrated) of the liquid crystal panel 200, so that images are displayed on a front plate of the liquid crystal panel 200.

The LED driving circuit 1 is connected with the LED array 100, and has: the LED driver 10 being a power-supply circuit of supplying a voltage applied to the LED array 100; and the current regulator 40 (constant-current driving controlling circuit, semiconductor device) for controlling to drive the LED array 100 under a constant current condition. The LED driver 10 has a power-supply control IC 20 and others. The current regulator 40 is a semiconductor device having: a plurality of the vertical semiconductor devices 700 (package 41) described above (in FIG. 1 and others); and the constant-current controlling circuit 60 (package 42).

Hereinafter, with reference to FIG. 5 and others, internal configurations of the current regulator 40 and the LED driver 10 in the LED driving circuit 1, their operations, and others are described.

<Current Regulator>

In FIG. 5, the current regulator (constant-current driving controlling circuit, semiconductor device) 40 is connected with n pieces of LED strings (S1 to Sn) of the LED array 100 in series. The current regulator 40 has: the plurality (n pieces) of vertical semiconductor devices 700 of driving the LED array 100 under the constant current condition; and the constant-current controlling circuit (constant-current control IC) 60 of controlling an ON voltage of the main MOS 500 in the vertical semiconductor device 700 so that the LED current (ILED) flowing in each of the n pieces of LED strings becomes the constant current. In the first embodiment, each of the plurality (n pieces) of main MOSs 500 and the constant-current controlling circuit 60 are individually packed in respective packages 41 and 42.

<Minimum-Voltage Detecting Circuit, Circuit-Breaking Switch During Dimming>

With reference to FIGS. 6 and 7A to 7C, a configuration example of the minimum-voltage detecting circuit 310 and others, a role of the circuit-breaking switch during dimming by the subsidiary MOS 320, and others are briefly described. FIG. 6 illustrates a functional block (one channel unit) of a configuration example of the minimum-voltage detecting circuit 310 inside the constant-current controlling circuit 60. Also, correspondingly, FIG. 7A to 7C illustrate voltage-waveform examples in the digital dimming. In the digital dimming, FIG. 7A illustrates the dimming signal (PWM), FIG. 7B illustrates the LED current, and FIG. 7C illustrates an ILED terminal voltage (V) (voltage of an input terminal such as the LED current ILED-1 or others in FIG. 1).

In FIG. 6, the minimum-voltage detecting circuit 310 is a corresponding circuit unit having the minimum-voltage selecting circuit 35 and others in FIG. 1. The minimum-voltage detecting circuit 310 has: the minimum-voltage selecting circuit 35; a short-circuit detecting circuit 34; an overvoltage detecting circuit 38; and others. The minimum-voltage selecting circuit 35 is one share unit among the plurality (for example, 4 pieces) of LED strings (S) (corresponding channel (C)) and the vertical semiconductor devices 700, and the short-circuit detecting circuit 34 and the overvoltage detecting circuit 38 individually exist for them in each channel.

The minimum-voltage selecting circuit 35 has: 4 pieces of diodes 351-1 to 351-4; high resistor R7; an error amplifier 354; and others. A cathode of respective diodes 351-1 to 351-4 is connected with the source (S2) (node B) of the respective circuit-breaking switch during dimming (subsidiary MOS 320). Also, anodes of the diodes 351-1 to 351-4 are combined at a node NDX-A, and are connected with the inverting input terminal of the error amplifier 354.

The short-circuit detecting circuit 34 has: a zener diode 341; a timer circuit 342; a comparator 343; a resistor R6; and others. When a voltage of the node B is over a zener voltage (voltage for determining short-circuit detection, which is, for example, 8 V) of the zener diode 341, the timer circuit 342 starts. If the voltage of the node B is still over the zener voltage after predetermined time, an output-voltage level of the comparator 343 becomes high. In this manner, a voltage level of the FLT terminal (in FIG. 1) of the minimum-voltage detecting circuit 310 also becomes high, so that an abnormal detection signal indicating the abnormal detection can be outputted to a microcomputer (not illustrated).

The overvoltage detecting circuit 38 has: a zener diode 381; a comparator 383; a resistor R8; and others. When the voltage of the node B is over a zener voltage (voltage for determining the overvoltage, which is, for example, 16 V) of the zener diode 381, an output-voltage level of the comparator 383 becomes high, so that an abnormal detection signal is outputted, and further, operations of the current regulator 40 and the LED driver 10 are immediately stopped (not illustrated).

The configuration example has a configuration in which a breakdown voltage between the sources (S1 and S2) of the subsidiary device 320 and the main device 500 is, for example, 20 V or larger for handling the zener voltage (voltage for determining the overvoltage, which is 16 V) of the overvoltage detecting circuit 38 (the breakdown voltage is set to be larger than the voltage for determining the overvoltage). Here, a required lower limit 20 V of the breakdown voltage is determined by an expression of "the voltage for determining the overvoltage which is 16 V/a derating factor γ (γ=0.8)".

When the digital dimming is operated, the main MOS 500 is turned off, and the voltage (V) of the input terminal of the LED current (ILED) is increased to be over a determining voltage for the LED short circuit, and therefore, a detecting circuit (protective circuit) is abnormally operated. Thus, when the dimming is operated, the subsidiary MOS 320 (circuit-breaking switch during dimming) is turned off, so that the abnormal operation of the detecting circuit (protective circuit) is prevented.

As illustrated in FIGS. 7A to 7C, in FIG. 7A, when a signal level of the dimming signal is low, the constant current (for example, 100 mA in the present embodiment) is flown in the LED, and, when it is high, the LED current becomes 0 mA. Since the current is not flown in the LED during the high-level period of the dimming signal, the terminal voltage (V) of each LED current (ILED-1 to ILED-4) becomes about 20 V obtained by dividing the output voltage Vout of the LED driver 10 by a capacitance of the LED string (S) and capacitances of the drain and source of the vertical semiconductor device 700. Therefore, the short-circuit detecting circuit 34 is abnormally operated. Further, the VDM (FIG. 1 and others) being the output signal (command signal) becomes at a maximum voltage level. And, if a control of "high dimming ratio" that a state of the LED current of 0 mA is occupied during almost entire dimming period is maintained for a long time, the output voltage Vout of the LED driver 10 is significantly decreased. Therefore, it takes long to return the LED current to the constant-current state of 100 mA, and therefore, the high dimming ratio cannot be maintained.

Thus, when the signal level of the dimming signal is high, it is required to provide the circuit-breaking switch during dimming of breaking a connection between the minimum-voltage detecting circuit 310 and the LED array 100. In the present embodiment, the circuit-breaking switch during dimming is provided with using the subsidiary MOS 320. In this manner, the output voltage (command signal) of the minimum-voltage detecting circuit 310 is maintained at a voltage which is the one immediately before the dimming signal becomes at the high level, and further, the output voltage (command signal) of the VDM terminal is also maintained by a capacitor 83 in FIG. 5, so that the output voltage Vout of the LED driver 10 is hardly decreased. Also, when the signal level of the dimming signal is high, the voltage (V) of each LED current terminal (ILED-1 to ILED-4) is not inputted into even the short-circuit detecting circuit 34, and therefore, the short-circuit detecting circuit 34 is not abnormally operated.

<Package (1)>

Figure 8:
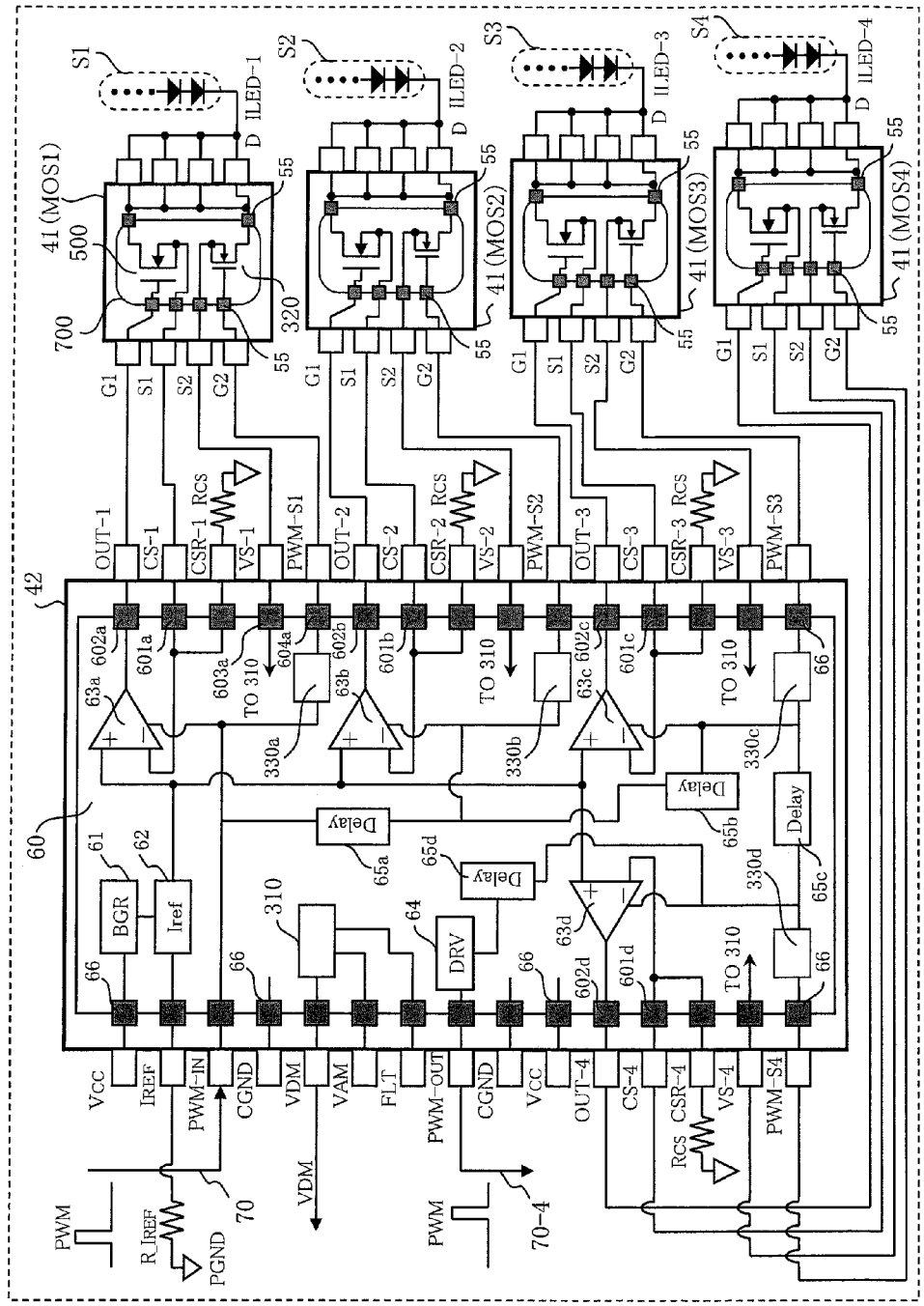
FIG. 8 is a diagram illustrating a configuration example of the vertical semiconductor devices, the constant-current controlling circuit, and a circuit functional block in which the vertical semiconductor devices and the constant-current controlling circuit are packed in one package, according to the first embodiment.

Next, as an internal configuration example of the current regulator 40, FIG. 8 illustrates a configuration example of the plurality (n pieces) of vertical semiconductor devices 700, the constant-current controlling circuit 60, and a circuit functional block in which the vertical semiconductor devices and the constant-current controlling circuit are packed in packages (41 and 42). That is, the configuration has: the package 41 (power MOS package) (MOS1 to MOS4) for the plurality (for example, 4 pieces) of vertical semiconductor devices 700; and the package 42 (constant-current control IC package) for one constant-current controlling circuit 60.

The constant-current controlling circuit 60 is a semiconductor integrated circuit having: a bandgap reference supply (BGR) 61; a voltage-level shifting device (Iref) 62 for setting the LED current; operational amplifiers 63a to 63d; delay circuits (Delay) 65a to 65d of delaying the inputted dimming signal; a driving circuit (DRV) 64 of outputting the delayed dimming signal; and the minimum-voltage detecting circuit 310 (in FIG. 6), which are integrated on one chip.

In the package 42 in which the constant-current controlling circuit 60 is packed, there are provided: a power terminal Vcc; an LED current set terminal $I_{REF}$; an input terminal $PWM_{IN}$ and an output terminal $PWM_{OUT}$ for the digital dimming signal (dimming signal); output terminals OUT-1 to OUT-4 for the operational amplifier 63; current sensing terminals CS-1 to CS-4; current sensing resistor terminals CSR-1 to CSR-4; the command-signal output terminal VDM; the inverting input terminal VAM for the operational amplifier; the output terminal FLT for an LED short-circuit detecting signal; and a logic grand terminal CGND.

Each of electrode pads 55 of the vertical semiconductor devices 700 and electrode pads 66 of the constant-current controlling circuit 60 is connected with a terminal of the packages 41 and 42 by a gold wiring or others. In the terminal of the package 41 in which the vertical semiconductor devices 700 are packed, the drain terminal D is connected with the cathode of the LED string S1, the gate terminal G1 is connected with the output terminal OUT-1 of the operational amplifier 63a, the gate terminal G2 is connected with the output terminal PWM-S1 of the PWM dimming controlling circuit 330a, the source terminal S1 is connected with the terminal CS-1, and the source terminal S2 is connected with the input terminal VS-1 of the minimum-voltage detecting circuit 310.

The gate terminals are separated to the G1 for the main MOS 500 and the G2 for the subsidiary MOS 320, respectively. This is because, if the G2 is not provided and the gate terminal is shared for them, when the LED is shorted out and the ILED terminal voltage is increased, the ON resistances of both of the MOSs are increased due to the function of the constant current control, and therefore, the shot-circuit detecting circuit cannot detect the correct ILED terminal voltage.

The LED current (ILED-1) flowing in the LED string S1 is inputted to the drain (D) of the main MOS 500 (MOS1), is outputted from the source (S1) of the same, is flown in the current sensing resistor Rcs through the CS-1 terminal and the CSR-1 terminal (the CS-1 terminal and the CSR-1 terminal are shorted out inside) of the constant-current controlling circuit 60, and is reached to the ground. A voltage generated at the CSR-1 terminal by the LED current flowing in the current sensing resistor Rcs is inputted to the inverting input terminal of the operational amplifier 63a. An output of the operational amplifier 63 is fed back so that the voltage is matched with a voltage set at the resistor R-I$_{REF}$ of the I$_{REF}$ terminal, so that the ON resistance of the main MOS 500 is adjusted. Therefore, a predetermined constant current is flown in the LED string S1. The sequential operation is also the same as those of other LED strings S2 to S4.

Note that, a switching circuit (not illustrated) in addition to a conventional operational amplifying circuit is embedded in the operational amplifier 63 (63a to 64d), so that the operational amplifier 63 has a function of, forcibly decreasing the gate voltage of the constant-current driving device (main MOS 500) to the low level when the voltage of the dimming signal inputted from the PWM.sub.IN terminal is at the high level, and turning the vertical MOSFET off. The function is also the same in the following descriptions.

Figure 9:
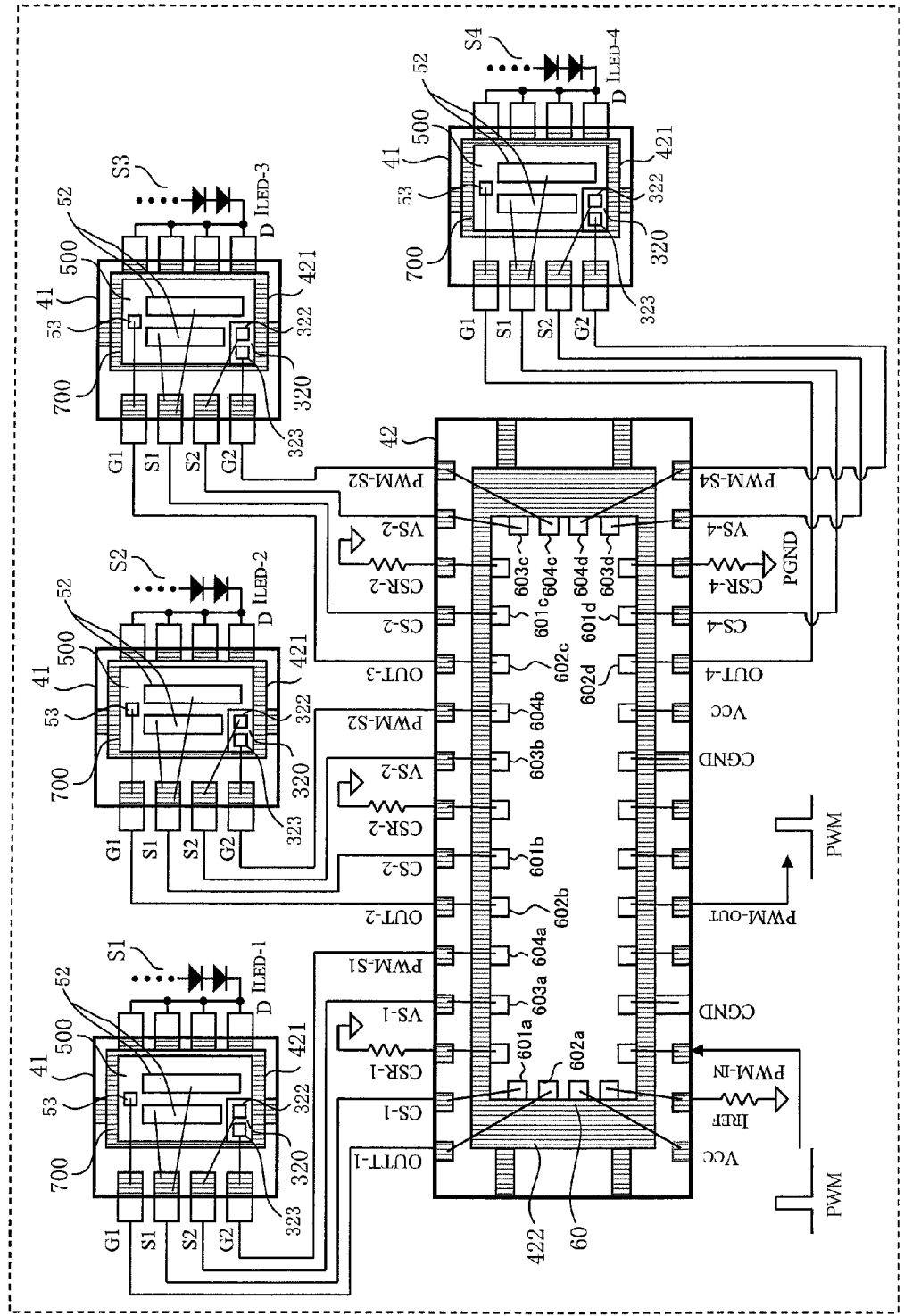
FIG. 9 is a diagram illustrating a packaging example in each package in FIG. 8.

Next, FIG. 9 illustrates a packaging example (discrete configuration) of the packages 41 and 42 in FIG. 8. Each of the 4 pieces of vertical semiconductor devices 700 is the n-channel vertical MOSFET illustrated in FIGS. 2 to 4 and others, and is electrically connected on a lead frame 421. That is, the drain electrode (not illustrated in FIG. 9, but formed on each rear surface of the vertical semiconductor devices 700 as illustrated in FIG. 2 and others) of the n-channel vertical MOSFET is connected with the lead frame 421 by, for example, a die-bonding material such as a silver paste. Also, the constant-current controlling circuit 60 is electrically connected on a lead frame 422.

On a printed circuit board (not illustrated), the lead frame 421 is connected with a metal-film wiring and a metal-film pad (not illustrated) connected with the LED string S (S1 to S4) in FIG. 8 through the drain terminal D and the lead frame 421 itself exposed on the rear surface of the package 41. Also, on a printed circuit board (not illustrated), the lead frame 422 is connected with a metal-film wiring and a metal-film pad (not illustrated) fixed at the ground voltage through the CGND terminal and the lead frame 422 itself exposed on the rear surface of the package 42.

The source electrode pad 52 and the gate electrode pad 53 are formed on a surface of one main MOS 500 (in FIG. 3), and are electrically connected with respective electrode pads 601a and 602a (in FIG. 8) on the constant-current controlling circuit 60 by a metal wiring and a wiring on the printed circuit board (not illustrated). Here, as illustrated in FIG. 8, the electrode pads 601a and 602a are connected with the inverting input of the operational amplifier 63a and the output of the operational amplifier 63a, respectively, by the metal-film wiring inside the device. The same wirings are provided also for the other three main MOSs 500.

The source electrode pad 322 and the gate electrode pad 323 are formed on a surface of one subsidiary MOS 320 (in FIG. 3), and are electrically connected with respective electrode pads 603a and 604a on the constant-current controlling circuit 60 (in FIG. 8) by a metal wiring and a wiring on a printed circuit board (not illustrated). Here, as illustrated in FIG. 8, the electrode pads 603a and 604a are connected with the input of the minimum-voltage detecting circuit 310 and the output of the PWM dimming controlling circuit 330a by the metal-film wiring inside the device. The same wirings are provided also for the other three subsidiary MOSs 320.

A size of the subsidiary MOS 320 is smaller than that of the main MOS 500, and is designed as small as about one tenth to one ten-thousandth of the main MOS 500.

Also, as described above (in FIG. 3), the gate electrode pad 53 of the main MOS 500 and the gate electrode pad 323 of the subsidiary MOS 320 are provided as far away as possible from each other on both ends of the vertical semiconductor device 700. This is for preventing bad influences to the constant-current control due to noises on the metal wiring connecting between the gate of the main MOS 500 and the operational amplifier 63 caused when the subsidiary MOS gate voltage in the dimming control are switched between 0 V and 12 V.

In addition to a treatment of the above-described layout against the noises, an operation order is controlled such that, the subsidiary MOS 320 is turned off after the main MOS 500 is turned off, and the main MOS 500 is returned to the constant-current driving state after the subsidiary MOS 320 is turned on. In this manner, the noise influence can be further reduced.

<Effects of First Embodiment and others>

As described above, according to the first embodiment (the vertical semiconductor device 700, the LED driving circuit 1, and others), the number and scale of the devices and the circuit (the semiconductor devices 700, the constant-current controlling circuit 60, and others) for controlling to drive the LED (LED array 100) under the constant current condition can be reduced more than the conventional one, and therefore, the increase of the footprint can be suppressed even if a large current is flown in the LED for the large-scaled display. Also, even if the constant-current controlling circuit 60 is a unit requiring a high voltage for handling the large current in the LED, an device with low-breakdown voltage of about 20 V can be used for the constant-current controlling circuit 60, and therefore, the increase of the fabrication cost for the IC chip or others of the device can be suppressed.

Figure 13:
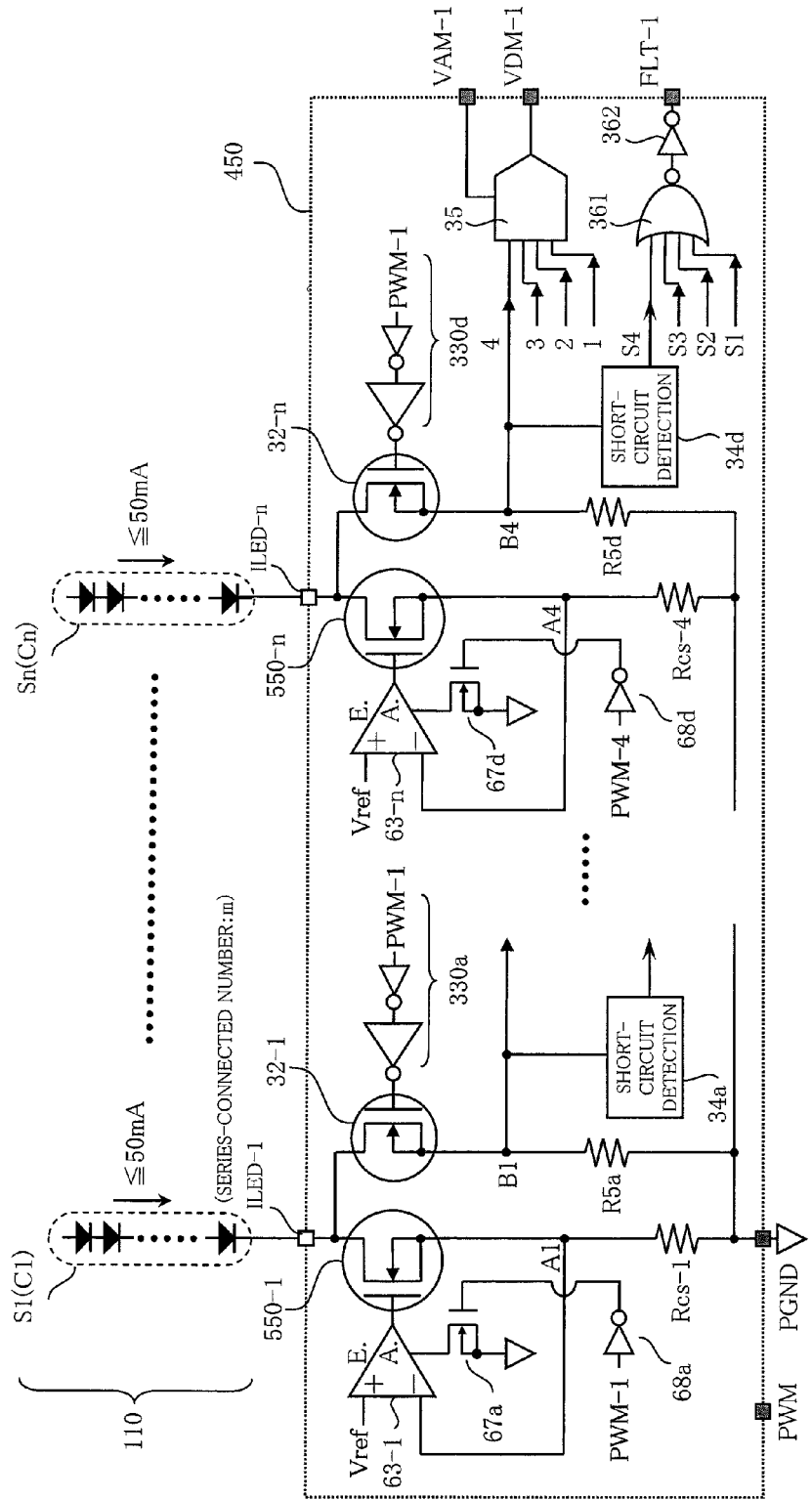
FIG. 13 is a diagram illustrating a configuration example of functional blocks of a current regulator (IC) and an LED array according to a conventional-technique example compared with the first embodiment.

Here, with reference to FIGS. 13 and 14, a comparative conventional technique is briefly described for simply explaining the effects of the first embodiment and others. FIG. 13 illustrates a configuration example of a functional block of a current regulator IC 450 and an LED array 110 (strings S1 to Sn) in the conventional technique. Note that the numbers of "m" and "n" in the conventional technique are different from those of the embodiment (in the embodiment, "n" is smaller and "m" is larger than those of the conventional one). However, simply, "n=4" is exemplified also in FIG. 13. Also, in FIG. 13, the package of the current regulator IC 450 and others are omitted.

Different points of a configuration in the conventional technique (in FIG. 13) from the configuration in the embodiment (in FIG. 1) are that constant-current driving devices 550-1 to 550-n and circuit-breaking switches 32-1 to 32-n during dimming are configured with a lateral-structural semiconductor device and are embedded in the current regulator IC 450, that the LED array 110 is configured with a conventional LED rated at 50 mA or lower, and others.

The constant-current driving devices 550-1 to 550-n used in the current regulator IC 450 of the conventional technique are configured with a lateral semiconductor device (for example, lateral MOSFET) which has a larger ON resistance than that of the vertical device of the first embodiment as illustrated in FIGS. 2 to 4. Therefore, in many cases, a maximum rated voltage of the lateral device is about 45 V (ON resistance of the same is several .OMEGA.), a maximum rated current of the same is about 50 to 60 mA, and a total LED current which can be flown in one current regulator IC 450 of the same is about 900 to 1000 mA.

Since the maximum rated voltage is about 45 V, the series-connected number (m) of the LEDs is up to 8 pieces in consideration of variation in forward voltages VF of the LEDs, and, for example, in an LED array 110 having an LED total number of 144 pieces, its parallel-connected number (n) is 18 pieces.

Further, when the LED current is as large as, for example, 100 mA, the configuration is considered as described above in which, for example, two constant-current driving devices are used in parallel to drive the LED string for one channel (for example, configuration in which two of the constant-current driving device 550-1 and its adjacent constant-current driving device are connected with the first LED string 51 in FIG. 13). In this case, the device number and the circuit scale of the plurality of constant-current driving devices 550-1 to 550-n and the constant-current controlling circuit of controlling the devices are 36 pieces twice as many as 18 pieces of the parallel-connected number (n), and therefore, the number of the required current regulator IC 450 adversely becomes twice.

FIG. 14 illustrates a graph of a relation between an LED current ([mA]) per channel (string) and a footprint (area ratio) of the current regulator IC 450 in the conventional technique (in FIG. 13). In the conventional technique, the lateral MOS is used, the LED series-connected number m is 8 pieces, and the LED total number is 144 pieces. As compared with "existing state" (50 mA/channel), the required number of the current regulator IC 450 is increased as increasing the LED current per channel as described above, and therefore, the footprint of the current regulator ICs is increased.

On the other hand, in the LED driving circuit 1 according to the first embodiment, for solving the problem of the increase of the footprint due to such a largely-increased LED current, the vertical device having a smaller ON resistance than that of the lateral device in spite of having the high breakdown voltage of 60 V or larger is used as the constant-current driving device (main MOS 500) as described above. For example, a vertical MOSFET whose size is about 1 mm$^2$ has an ON resistance of several ten mΩ. In this manner, in the first embodiment, for using a large-scaled panel whose LED total number is about 80 to 200 pieces, the series-connected number (m) of the LEDs is increased to 12 pieces or more, and the series-connected number (m) of the LEDs is more than the parallel-connected number (n) of the same compared with the conventional one so that the parallel-connected number (n) is reduced (m≥12 and m>n). Therefore, the required number and scale of the constant-current driving devices (semiconductor devices 700) and the constant-current controlling circuit 60 can be reduced. Note that the above-described conditions of "m" and "n" are merely compared with the conventional one, and the semiconductor device 700 itself is characterized in the configuration itself, and therefore, even in a condition of not only "m>n" but also, for example, "m.apprxeq.n", a proper effect can be obtained.

Further, even if only the constant-current driving device is configured with the vertical semiconductor device, an device with a high breakdown voltage of about 60 V to 100 V is required for the chip of the constant-current controlling circuit (current regulator). This is because it is required to form the circuit-breaking switches (32-1 to 32-n) during dimming inside the chip. Therefore, a fabrication process for the IC is complicated (a fabrication process of forming a switch so as to have a high breakdown voltage is required), thus, the problem of the increase of the fabrication cost is caused.

Accordingly, as illustrated in FIG. 1 and others, the first embodiment has the configuration in which not only the constant-current driving device (main MOS 500) but also the circuit-breaking switch (subsidiary MOS 320) during dimming are configured with the vertical semiconductor device inside each semiconductor device 700 (package 41). In this manner, even if the constant-current controlling circuit 60 (current regulator 40) is the unit requiring the high voltage, a device with a low breakdown voltage of about 20 V can be used.

Second Embodiment

Figure 10:
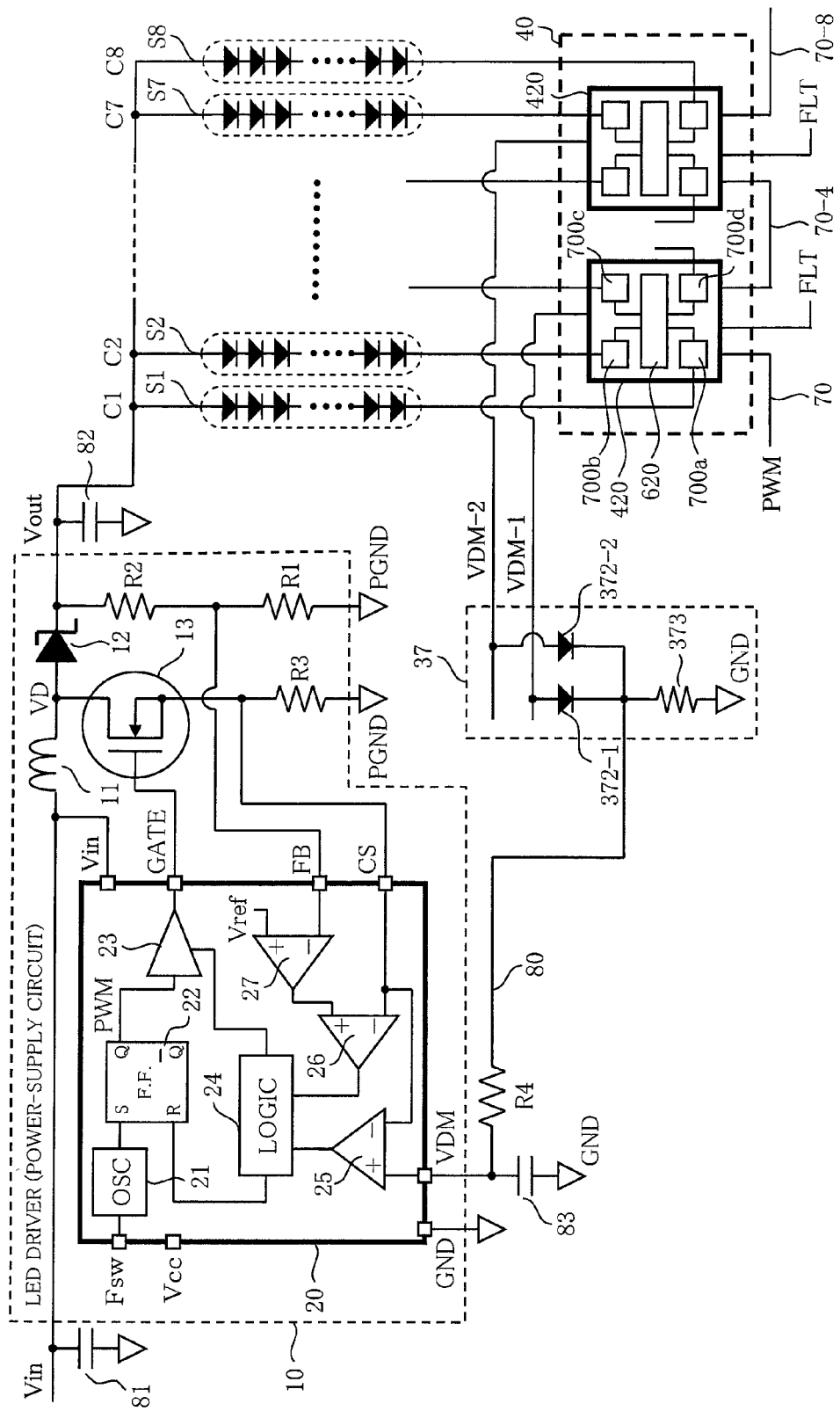
FIG. 10 is a diagram illustrating a configuration example of a functional block of a current regulator with an LED driving circuit, an LED array, and others, according to a second embodiment of the present invention.
Figure 11:
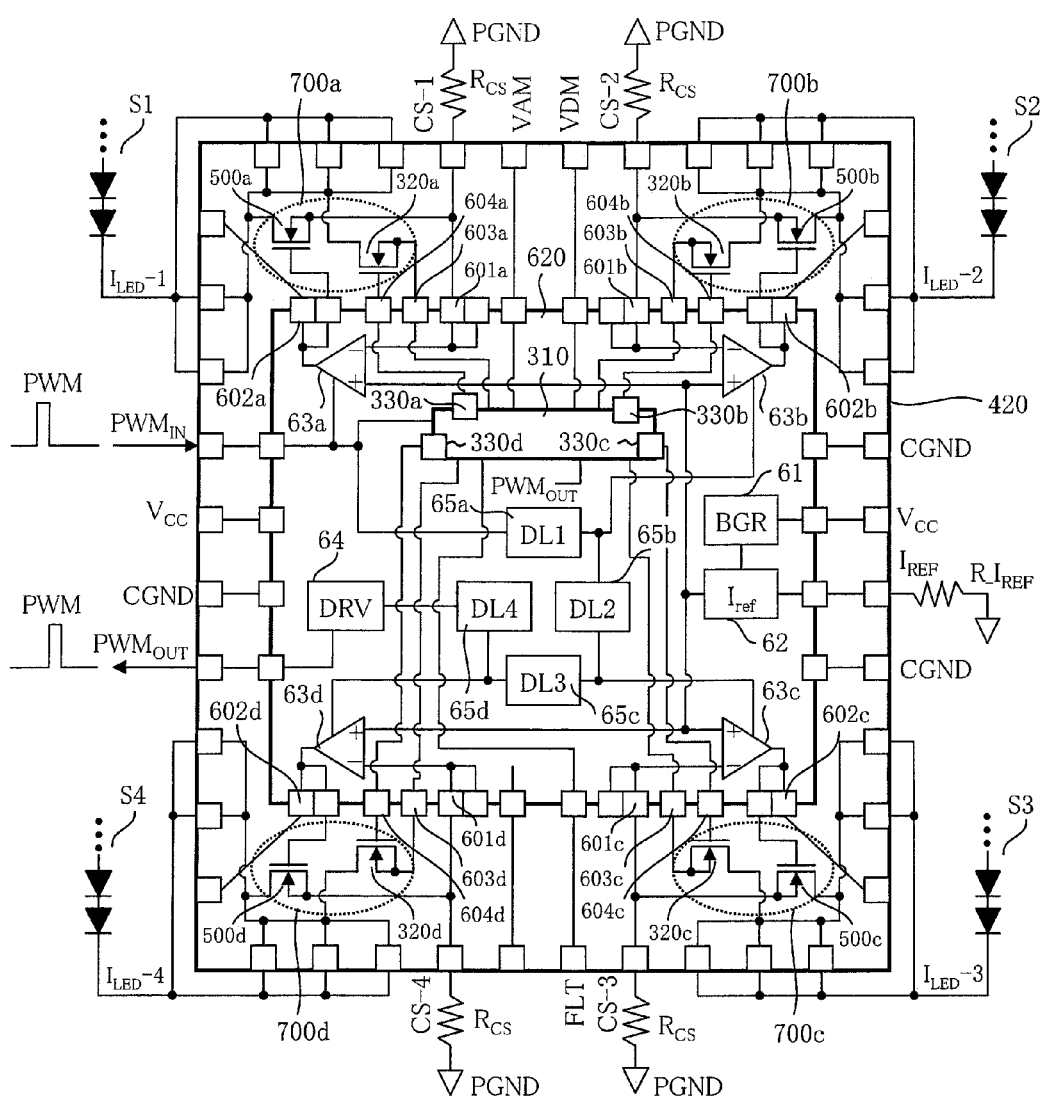
FIG. 11 is a diagram illustrating a configuration example of a functional block of a circuit and a package in which a plurality of vertical semiconductor devices and a constant-current controlling circuit are packed, according to the second embodiment.
Figure 12:
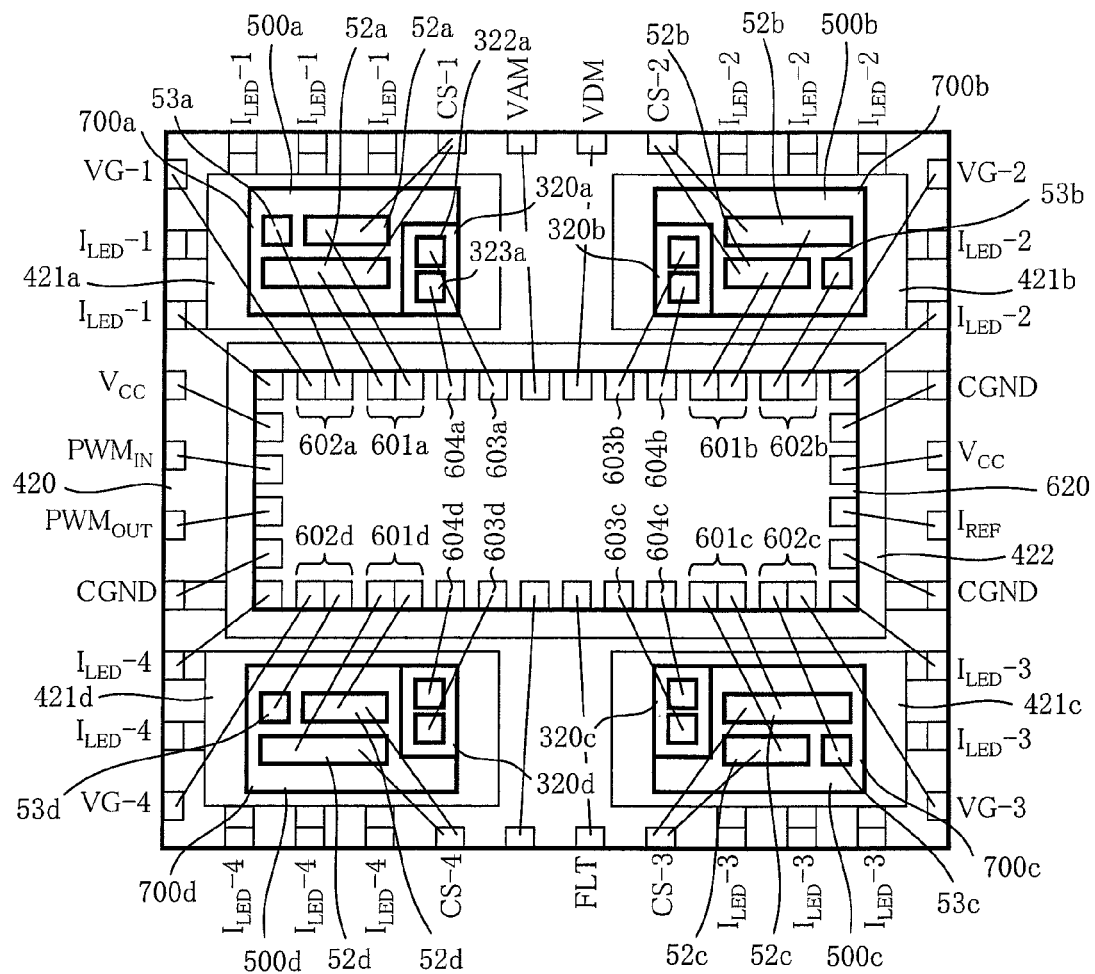
FIG. 12 is a diagram illustrating a packaging example of the package in FIG. 11.

Next, with reference to FIGS. 10 to 12, an LED driving circuit according to a second embodiment of the present invention and others are described. The LED driving circuit according to the second embodiment has a SiP (system in package) configuration (configuration in which a plurality of chips are sealed in one package).

FIG. 10 illustrates a configuration example of a current regulator 40, an LED driver 10, an LED array 100, and others in the LED driving circuit according to the second embodiment. A different point of a configuration in the second embodiment (in FIG. 10) from the configuration in the first embodiment (current regulator 40 and others in FIG. 5) is that, the vertical semiconductor devices 700 (700a to 700d) are connected to form, for example, a plurality (4 pieces in the present embodiment) of channels as one unit in the LED array 100 with "n=8" (LED strings 51 to S8) (corresponding channels C1 to C8), and the vertical semiconductor devices 700 and a constant-current controlling circuit 620 of controlling the devices are integrally packed in one package 420.

Further, entirely, a plurality of the packages 420 each configured with the plurality of channel units are used. That is, in the present embodiment, two packages 420 each having the 4 channel units are used for the 8 channels (C1 to C8) of the LED array 100.

Still further, in the LED driving circuit, a command signal is outputted from a VDM terminal of each package 420. Therefore, there is provided a command-signal selecting circuit 37 of selecting a maximum voltage (command signal) from a plurality (these two) of command signals (VDM-1 and VDM-2) (that is, a minimum voltage among the 8 channels is selected by the command-signal selecting circuit). The command-signal selecting circuit 37 has two diodes 372-1 and 372-2, a resistor 373, and others. A cathode (output of the command-signal selecting circuit 37) of the diodes 372-1 and 372-2 combined at the same node is connected with a VDM terminal of a power-supply control IC 20 of the LED driver 10 through a resistor R4 and a capacitor 83.

<Package (2)>

FIG. 11 illustrates a configuration example of a functional block of circuits and a package in a state that the plurality (4 pieces) of vertical semiconductor devices 700a to 700d and the constant-current controlling circuit 620 are packed in one package 420.

Inside the package 420, total 5 semiconductor devices of the 4 pieces of vertical semiconductor devices 700a to 700d and the constant-current controlling circuit 620 of controlling to drive the semiconductor devices under a constant current condition are embedded. While a layout of the constant-current controlling circuit 620 is different from that of the constant-current controlling circuit 60 (in FIG. 8 and others) according to the first embodiment, its function is the same.

A dimming signal (PWM) is inputted from a PWM.sub.IN terminal through a dimming signal wiring 70 (in FIG. 10) to the constant-current controlling circuit 620, and then, is inputted to an operational amplifier 63a and a delay circuit 65a. The operational amplifier 63a turns a constant-current driving device 500a to ON (constant-current state) or OFF (zero-current state) in accordance with the dimming signal. A dimming signal delayed by the delay circuit 65a is inputted to an operational amplifier 63b and a delay circuit 65b. The operational amplifier 63b turns a constant-current driving device 500b to ON or OFF in accordance with the dimming signal. A dimming signal delayed by the delay circuit 65b is inputted to an operational amplifier 63c and a delay circuit 65c. The operational amplifier 63c turns a constant-current driving device 500c to ON or OFF in accordance with the dimming signal. A dimming signal delayed by the delay circuit 65c is inputted to an operational amplifier 63d and a delay circuit 65d. The operational amplifier 63d turns a constant-current driving device 500d to ON or OFF in accordance with the dimming signal.

A dimming signal delayed by the delay circuit 65d is outputted from a $PWM_{OUT}$ terminal by a driving circuit 64, and then, is inputted through a dimming signal wiring 70-4 to another constant-current controlling circuit 620 controlling a current of the next LED string S5. The inputted dimming signal is similarly delayed inside the circuit, and then, is continuously sent to a next-stage constant-current controlling circuit 620. In this manner, similarly to the first embodiment, only one dimming-signal line is used as a wiring area for the dimming signals, and therefore, only one dimming signal is required to be generated at a microcomputer. Note that the operation content in controlling the LED current to the constant current is the same as that described in the first embodiment.

FIG. 12 illustrates a packaging example of the package 420 in FIG. 11. The 4 pieces of vertical semiconductor devices 700a to 700d is the n-channel vertical MOSFETs described in the first embodiment (in FIGS. 2 to 4), and are electrically connected on lead frames 421a to 421d, respectively. That is, drain electrodes (not illustrated in FIG. 12, but formed on respective rear surfaces of the constant-current driving devices 500a to 500d as illustrated in FIG. 2 and others) of the n-channel vertical MOSFETs are connected with respective lead frames 421a to 421d by, for example, a die-bonding material such as a silver paste. Also, the constant-current controlling circuit 620 is electrically connected on a lead frame 422.

On a printed circuit board (not illustrated), the lead frames 421a to 421d are connected with metal-film wirings and metal-film pads (not illustrated) connected with the LED strings 51 to S4 in FIG. 11 through terminals ILED-1 to ILED-4 and the lead frames 421a to 421d themselves exposed on the rear surfaces of the package 420, respectively. Also, on a printed circuit board (not illustrated), the lead frame 422 is connected with a metal-film wiring and a metal-film pad (not illustrated) fixed at a ground voltage through a CGND terminal and the lead frame 422 itself exposed on the rear surface of the package 420.

A source electrode pad 52a and a gate electrode pad 53a are formed on a front surface of the constant-current driving device (main MOS) 500, and are connected with electrode pads 601a and 602a on the constant-current controlling circuit 620 by metal wirings, respectively. Here, as illustrated in FIG. 11, the electrode pads 601a and 602a are connected with the inverting input terminal of the operational amplifier 63a and the output terminal of the operational amplifier 63a by the metal-film wirings inside the device, respectively. The same wirings as those of 500a are provided also in the other constant-current driving devices (500b to 500d).

A source electrode pad 322a and a gate electrode pad 323a are formed on a front surface of the circuit-breaking switch (subsidiary MOS) 320a during dimming, and are connected with the electrode pads 603a and 604a on the constant-current controlling circuit 620 by metal wirings, respectively. Here, as illustrated in FIG. 11, the electrode pads 603a and 604a are connected with the input terminal of the minimum-voltage detecting circuit 320 and the output terminal of the PWM dimming controlling circuit 330a by the metal-film wirings inside the device, respectively. The same wirings are provided in the other three subsidiary MOSs (320b to 320d).

<Power-Supply Control IC>

In FIG. 10, the power-supply control IC 20 has: an oscillator (OSC) 21; a flip-flop circuit 22; a driving circuit 23; a logic circuit 24; comparators 25 and 26; an error amplifier 27; and others.

A basic circuit configuration of the LED driver 10 using the power-supply control IC 20 is the same as that of a general boost switched-mode power supply circuit. That is, the LED driver 10 has: a switching device 13; a choke coil 11; a Schottky diode 12; resistors R1, R2, and R3; the power-supply control IC 20; and others. An input capacitor 81 is connected with an input side of the LED driver 10, and an output capacitor 82 is connected with an output side of the same.

In the LED driver 10, an input voltage Vin is boosted through the choke coil 11 by a switching operation of the switching device 13, and then, is supplied through the Schottky diode 12 to the LED array 100 as an output voltage Vout. An initial set voltage of Vout is determined by the resistors R1 and R2. For example, when a reference voltage of an FB terminal of the power-supply control IC 20 is 1.25 V, an ON period of the switching device 13 is controlled by the power-supply control IC 20 as comparing the FB-terminal voltage with an CS-terminal (current sensing terminal) voltage by the comparator 26 so that a relation of "Vout=1.25×R1+R2)/R1" is satisfied.

Here, a method of controlling a power supply circuit of reducing power consumption of constant-current driving devices (main MOSs) 500a to 500d formed in the vertical semiconductor devices 700a to 700d is described.

Since sum of the forward voltage VF of each LED is increased as increasing the series-connected number (m) of the LEDs, it is required to increase the output voltage Vout of the LED driver 10 in FIG. 10. At this time, in consideration of variation in the forward voltage VF of each LED, the Vout is generally set as assuming a case that all LEDs each having a maximum VF are connected in series. However, practically, the VFs of all LEDs connected in series are not maximized, and therefore, an unnecessary high voltage is applied to each constant-current driving device. As a result, waste power is consumed in each constant-current driving device, and further, load is applied to the package (420) and others by large increase in temperature by power consumption.

A forward voltage VF of a white-light LED is, for example, normally 3.4 V, and 4.0 V at maximum in the LED current of 60 mA. Therefore, when the series-connected number (m) of the LEDs is 18 pieces, the Vout is set to 75 to 80 V in consideration of a worst condition (maximum condition) of the variation of the VFs. However, practically, such a worst condition is not caused. For example, when the VFs are averagely in the normal condition of 3.4 V, an unnecessary voltage of 14 to 19 V is applied to each constant-current driving device, and therefore, a loss of 0.8 to 1.1 W per one constant-current driving device is caused in the LED current of 60 mA. In a largely-increased LED current of 100 mA or larger, the loss is further increased.

For preventing this problem, in the second embodiment, the minimum voltage among voltages of terminals on the LED-string side of the constant-current driving devices 500a to 500d (that is the LED string to which the maximum voltage is applied) is detected, and the output voltage Vout of the LED driver 10 is decreased so that the minimum voltage becomes a minimum voltage required for the constant-current driving.

That is, in the minimum-voltage detecting circuit 310 according to the second embodiment, the voltages of the terminals on the LED-string side of the constant-current driving devices (main MOSs) 500 (500a to 500d) are inputted to the terminals of the ILED-1 to ILED-4, respectively, and a minimum voltage VDx among the voltages is selected by the minimum-voltage selecting circuit 35 in FIG. 6, and a voltage of "VDx+VBE" (VBE is a forward voltage of the diode) is inputted to the inverting input terminal of the error amplifier 354. A voltage of "VD0+VBE" (VD0 is the minimum voltage required for the constant-current driving) is inputted to an non-inverting input terminal of the error amplifier 354, a difference between the VDx and the VDO is amplified, and is outputted as the command signals VDM (VDM-1 and VDM-2) from the VDM terminal to the power-supply control IC 20.

In FIG. 10, when the LED driver 10 is started, the voltage Vout is boosted in the power-supply control IC 20 in accordance with the initial set voltage. After predetermined time, a loop for the feedback control is switched to control the output voltage in accordance with the voltage of the command signal (VDM signal) 80. That is, in the power-supply control IC 20, the ON period of the switching device 13 is controlled as comparing the VDM-terminal voltage with the CS-terminal (current-sensing terminal) voltage by the comparator 25. As a result, the minimum voltage VDx is controlled so as to be equal to the minimum voltage VD0 required for the constant-current driving. Here, the resistor R4 and the capacitor 83 in FIG. 10 have a function of setting time constant variation of the VDM signal longer than a switching period in order to stabilize the feedback control of the LED driver 10. <Effects of Second Embodiment and others>

As described above, according to the second embodiment, the same effects with the first embodiment can be obtained, and further, the following effects can be obtained. According to the LED driving circuit of the second embodiment, the plurality of vertical semiconductor devices 700a to 700d and the constant-current controlling circuit 620 of controlling the semiconductor devices are packed in one package 420, so that a part of the configuration of the constant-current controlling circuit can be shared by the plurality of vertical semiconductor devices 700. In this manner, the footprint can be further reduced.

Here, with reference to FIG. 15 in addition to FIGS. 13 and 14, the effects of the second embodiment (and the first embodiment) and others are described by compared with the conventional technique. FIG. 15 illustrates a graph of a relation between an LED current per channel and a footprint (area ratio) of the current regulator in each LED driving circuit of the conventional technique and the first and second embodiments. A line "A" illustrates a case of the first embodiment (the above-described discrete configuration). A line "B" illustrates a case of the second embodiment (the configuration that the above-described 5 devices are packed in one package). Both of A and B illustrate a case that a vertical MOS is used, the LED series-connected number m is 18 pieces, and the LED total number is 144 pieces (n=8). In a case of using the current regulator IC 450 according to the conventional technique illustrated in FIG. 13, the LED current per channel in the existing state is about 50 mA similarly to that illustrated in FIG. 14, and the footprint is increased in proportion to the increase of the LED current.

On the other hand, in a case of using the current regulator 40 (in FIGS. 5 and 10, and others) in the LED driving circuit of the first or second embodiment, a vertical device with a high breakdown voltage and a low ON resistance can be used, so that the number of devices for driving the LED under a constant current condition can be reduced, and therefore, even if the LED current per channel becomes a largely-increased current of about 350 mA, the footprint can be maintained as almost same as that in the case of 50 mA. Also, as the second embodiment, the footprint can be further reduced by rather the integration of 5 semiconductor devices in one package 420.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, as illustrated in FIGS. 5 and 10, although the boost switched-mode power supply circuit is used for the LED driver 10 in each LED driving circuit of the first and second embodiments, the same effects can be obtained even when a buck switched-mode power supply circuit or a buck/boost switched-mode power supply circuit is used. Also, as illustrated in FIGS. 2 to 4, although the vertical MOSFET is used for the constant-current driving device 500 in each vertical semiconductor device 700 of the first and second embodiments, a vertical bipolar transistor may be used. Further, although the configuration in which the constant-current driving devices for 4 channels and the chip of the constant-current controlling circuit for the devices are integrated in one package is used in the LED driving circuit of the second embodiment, the number of channels driven under the constant current condition, the number of integrated chips, and others are not limited to the above-described examples and can be properly changed.

The present invention (for a semiconductor device, an LED driving circuit, and others) is particularly effective for a driving of carrying a uniformed constant current in an LED array connected in multi series and multi parallel, and can be used for an LED backlight used for a liquid crystal display such as a liquid crystal television and a PC, a power-supply circuit such as a large-scaled LED illumination, and others.

What is claimed is:

1. A semiconductor device on a chip and for driving an LED, comprising:
   a semiconductor element in which a current is flown in a vertical direction,
   wherein the semiconductor element is a vertical type MOSFET,
   wherein the semiconductor element comprises:
      a main element functioning as a current driving device and
      a subsidiary element functioning as a circuit-breaking switch during dimming,
   wherein the main element and the subsidiary element share a drain region,
   wherein the main element has a first source region and a first gate electrode,
   wherein the subsidiary element has a second source region and a second gate electrode, and
   wherein the first source region and the second source region are formed in a first surface of the chip of the semiconductor device and are of a first conductivity type, and are electrically insulated from each other through an isolation region formed in the first surface and is of a second conductivity type having an opposite polarity to that of the first conductivity type.

2. The semiconductor device according to claim 1, wherein, in the first surface, an area of the second source region is smaller than that of the first source region.

3. The semiconductor device according to claim 1, wherein the semiconductor device is connected with a controlling circuit of controlling a current flowing in the LED so as to be a constant current, and
a breakdown voltage between the first source region and the second source region is larger than a voltage for determining overvoltage of an overvoltage detecting circuit in the controlling circuit.

4. The semiconductor device according to claim 1, wherein, on both ends in the first surface, an electrode pad of the first gate electrode and an electrode pad of the second gate electrode are provided away from each other.

5. A semiconductor device on a chip and for driving an LED, comprising:
a semiconductor element in which a current is flown in a vertical direction,
wherein the semiconductor element is formed of a vertical type bipolar transistor,
wherein the semiconductor element comprises:
a main element functioning as a constant-current driving device and a subsidiary device functioning as a circuit-breaking switch during dimming,
wherein the main element and the subsidiary element share a collector region,
the main element has a first emitter region and a first base electrode,
the subsidiary element has a second emitter region and a second base electrode, and
the first emitter region and the second emitter region are formed in a first surface of the chip of the semiconductor device and are of a first conductivity type, and are electrically insulated from each other through an isolation region formed in the first surface and is of a second conductivity type having an opposite polarity to that of the first conductivity type.

6. A semiconductor device on a chip and for driving LEDs, comprising:
a plurality of driving elements each coupled to one of the LEDs; and
a controlling circuit coupled to the plurality of driving elements for controlling a current flowing in the LEDs so as to be a constant current,
wherein each of the plurality of driving elements uses a vertical type semiconductor element in which a current is flown in a vertical direction,
wherein the vertical semiconductor element is of a vertical type MOSFET, and including:
a main element functioning as a constant-current driving device and
a subsidiary element functioning as a circuit-breaking switch during dimming,
wherein the main element and the subsidiary element share a drain region,
wherein the main element has a first source region and a first gate electrode,
wherein the subsidiary element has a second source region and a second gate electrode,
wherein the first source region and the second source region are formed in a first surface of the chip of the semiconductor driving device and are of a first conductivity type, and are electrically insulated from each other through an isolation region formed in the first surface and is of a second conductivity type having an opposite polarity to that of the first conductivity type,
wherein the controlling circuit controls a conduction state between the main element and the subsidiary element in each of the plurality of driving elements, and
wherein the controlling circuit and the plurality of driving elements are integrated in one package.

7. The semiconductor device according to claim 6, wherein, in the first surface, an area of the second source region is smaller than that of the first source region.

8. The semiconductor device according to claim 6, wherein a breakdown voltage between the first source region and the second source region is larger than the voltage for determining overvoltage of an overvoltage detecting circuit in the controlling circuit.

9. The semiconductor device according to claim 6, wherein, on both ends in the first surface, an electrode pad of the first gate electrode and an electrode pad of the second gate electrode are provided away from each other.

10. The semiconductor device according to claim 6, wherein the first source region is grounded through a current sensing resistor connected in series with the first source region, and further, is connected with an inverting input of an operational amplifier in the controlling circuit,
an output of the operational amplifier is connected with the first gate electrode,
the second source region is connected with a detecting circuit in the controlling circuit, and
the second gate electrode is connected with a PWM dimming controlling circuit in the controlling circuit.

11. The semiconductor device according to claim 6, wherein a detecting circuit in the controlling circuit detects a voltage of terminals on input sides of the plurality of driving devices, and
the semiconductor device has a terminal of outputting a voltage obtained by amplifying a difference between a predetermined voltage and the voltage detected by the detecting circuit in the controlling circuit as a command signal for a power-supply circuit connected with the semiconductor device for supplying power to the LED.

12. An LED driving circuit of driving an LED array having n pieces of LED strings coupled in parallel each having m pieces of LEDs coupled in series, comprising:
a plurality of driving elements each coupled to one LED string in series and for driving the one LED string under a constant current condition; and
a controlling circuit coupled to the plurality of driving elements in series and for controlling an ON voltage of each of the plurality of driving elements so that a current flowing in each LED string of the LED array becomes the constant current,
wherein the controlling circuit has a minimum-voltage detecting circuit to which a voltage of each terminal on the LED string side in each of the plurality of driving elements is inputted, which selects a minimum voltage among the voltages, and which outputs a command signal, based on a difference between the minimum voltage and a predetermined set voltage, to a power-supply circuit connected with the controlling circuit for supplying power to the LED array,
wherein each of the plurality of driving elements uses a semiconductor element in which a current is flown in a vertical direction, wherein the semiconductor element on a chip and is of a vertical type MOSFET, and including:
  a main element functioning as a constant-current driving device and
  a subsidiary element functioning as a circuit-breaking switch during dimming,
wherein the main element and the subsidiary device share a drain region,
wherein the main element has a first source region and a first gate electrode,
wherein the subsidiary element has a second source region and a second gate electrode, and
wherein the first source region and the second source region are formed in a first surface of the chip of the driving element and are of a first conductivity type, and are electrically insulated from each other through an isolation region formed in the first surface and is of a second conductivity type having an opposite polarity to that of the first conductivity type.

13. An LED driving circuit of driving an LED array having n pieces of LED strings coupled in parallel each having m pieces of LEDs coupled in series, comprising:
  a plurality of driving elements each coupled to one LED string in series for driving the one LED string under a constant current condition; and
  a controlling circuit coupled to the plurality of driving elements in series and for controlling an ON voltage of each of the plurality of driving elements so that a current flowing in each LED string of the LED array becomes the constant current,
  wherein the controlling circuit has a minimum-voltage detecting circuit to which a voltage of each terminal on the LED string side in each of the plurality of driving elements is inputted, which selects a minimum voltage among the voltages, and which outputs a command signal, based on a difference between the minimum voltage and a predetermined set voltage, to a power-supply circuit connected with the controlling circuit for supplying power to the LED array,
  wherein each of the plurality of driving elements uses a semiconductor element in which a current is flown in a vertical direction,
  wherein the semiconductor element on a chip and is of a vertical type MOSFET, and including:,
    a main element functioning as a constant-current driving device and
    a subsidiary device functioning as a circuit-breaking switch during dimming are formed,
  wherein the main element and the subsidiary device share a drain region,
  wherein the main element has a first source region and a first gate electrode,
  wherein the subsidiary element has a second source region and a second gate electrode,
  wherein the first source region and the second source region are formed in a first surface of the chip of the driving element and are of a first conductivity type, and are electrically insulated from each other through an isolation region formed in the first surface and is of a second conductivity type having an opposite polarity to that of the first conductivity type,
  wherein the controlling circuit controls a conduction state between the main element and the subsidiary element in each of the plurality of driving devices, and
  wherein the controlling circuit and the plurality of driving elements are integrated in one package.

14. An apparatus for displaying images comprising:
  an LED array having n pieces of LED strings coupled in parallel each having m pieces of LEDs coupled in series;
  a display panel using the LED array as a backlight; and
  an LED driving circuit of driving the LED array,
  wherein the LED driving circuit is the LED driving circuit according to claim 12.

15. An apparatus for displaying images comprising:
  an LED array having n pieces of LED strings connected in parallel each having m pieces of LEDs connected in series;
  a display panel using the LED array as a backlight; and
  an LED driving circuit of driving the LED array,
  wherein the LED driving circuit is the LED driving circuit according to claim 13.

* * * * *